(12) United States Patent
Sakayori

(10) Patent No.: US 8,071,273 B2
(45) Date of Patent: Dec. 6, 2011

(54) POLYIMIDE PRECURSOR, RESIN COMPOSITION COMPRISING THE POLYIMIDE PRECURSOR, PATTERN FORMING METHOD USING THE RESIN COMPOSITION, AND ARTICLES PRODUCED BY USING THE RESIN COMPOSITION

(75) Inventor: Katsuya Sakayori, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 12/412,565

(22) Filed: Mar. 27, 2009

(65) Prior Publication Data

US 2009/0263745 A1    Oct. 22, 2009

(30) Foreign Application Priority Data

| Mar. 31, 2008 | (JP) | ................................. | 2008-089461 |
| Mar. 31, 2008 | (JP) | ................................. | 2008-089561 |
| Mar. 31, 2008 | (JP) | ................................. | 2008-090028 |
| Mar. 31, 2008 | (JP) | ................................. | 2008-090191 |
| Mar. 31, 2008 | (JP) | ................................. | 2008-090237 |
| Mar. 31, 2008 | (JP) | ................................. | 2008-090341 |
| Sep. 29, 2008 | (JP) | ................................. | 2008-251134 |
| Sep. 29, 2008 | (JP) | ................................. | 2008-251425 |

(51) Int. Cl.
   G03F 7/28       (2006.01)
   G03F 7/038      (2006.01)
   G03F 7/039      (2006.01)

(52) U.S. Cl. ............... 430/280.1; 430/270.1; 430/281.1; 430/283.1; 430/288.1; 430/325; 430/326

(58) Field of Classification Search ........................ None
See application file for complete search history.

(56) References Cited

U.S. PATENT DOCUMENTS

| 4,093,461 | A |   | 6/1978 | Loprest et al. | |
| 4,243,743 | A |   | 1/1981 | Hiramoto et al. | |
| 4,849,501 | A | * | 7/1989 | Diller et al. ..................... | 528/353 |
| 5,171,828 | A | * | 12/1992 | Meterko et al. ................. | 528/353 |
| 5,397,682 | A | * | 3/1995 | Matsuoka et al. .......... | 430/283.1 |
| 5,399,655 | A | * | 3/1995 | Simmons, III ................ | 528/128 |
| 5,691,100 | A | * | 11/1997 | Kudo et al. .................... | 430/170 |
| 2003/0064235 | A1 | * | 4/2003 | Okawa et al. ............. | 428/473.5 |
| 2005/0256295 | A1 | * | 11/2005 | Sakayori ........................ | 528/310 |
| 2009/0208868 | A1 | * | 8/2009 | Okazaki et al. ............ | 430/281.1 |

FOREIGN PATENT DOCUMENTS

| EP | 0 224 680 A2 | 6/1987 |
| JP | 52013315 A | 2/1977 |
| JP | 59-52822 B2 | 12/1984 |
| JP | 61-293204 A | 12/1986 |
| JP | 62-135824 A | 6/1987 |
| JP | 02-181149 A | 7/1990 |
| JP | 06-043648 A | 2/1994 |
| JP | 2000-119520 A | 4/2000 |
| JP | 2001-194784 A | 7/2001 |
| JP | 2002-121382 A | 4/2002 |
| JP | 2005-115249 A | 4/2005 |
| WO | WO-2007007730 A1 * | 1/2007 |

OTHER PUBLICATIONS

"Reactive Groups| CAMEO Chemicals| NOAA" downloaded from the web on Jul. 23, 1010 from http://cameochemicals.noaa.gov/;browse/react, 2 pages.*

(Continued)

*Primary Examiner* — Cynthia Hamilton
(74) *Attorney, Agent, or Firm* — Ladas & Parry LLP

(57) ABSTRACT

It is a main object of the present invention to provide a polyimide precursor and a polyimide precursor resin composition, which precursor being easy to synthesize, available at low cost, excellent in storage and capable of giving polyimide that is low in impurities after imidization, irrespective of the chemical structure of the finally-obtained polyimide.

It is another object of the present invention to provide a polyimide precursor having repeating units represented by the following formula (1) and a photosensitive resin composition comprising the polyimide precursor and a photoacid generator or photobase generator:

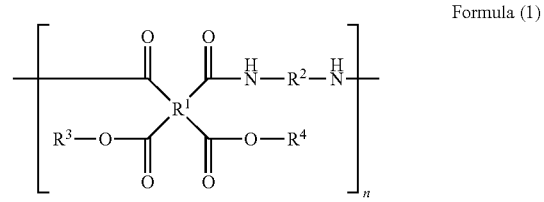

Formula (1)

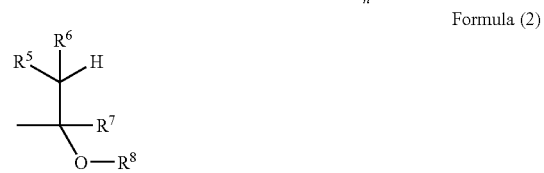

Formula (2)

In the formula (1), $R^1$ is a tetravalent organic group; $R^2$ is a divalent organic group; $R^1$s may be the same or different from each other and $R^2$s may be the same or different from each other in the repeating units; $R^3$ and $R^4$ respectively represent a monovalent organic group having a structure represented by the following formula (2) and may be the same or different from each other; and $R^3$s and $R^4$s in the repeating units may be the same or different from each other, respectively. In the formula (2), $R^5$, $R^6$ and $R^7$ respectively represent a hydrogen atom, a halogen atom or a monovalent organic group; $R^8$ is a monovalent organic group; $R^8$s in the repeating units may be the same or different from each other; 35 mole % or less of $R_8$s are organic groups having a reactive group; and $R^5$, $R^6$, $R^7$ and $R^8$ may be bonded to each other to form a ring structure.

6 Claims, 7 Drawing Sheets

OTHER PUBLICATIONS

"Not Chemi ally Reactive | CAMEO Chemicals| NOAA" downloaded from the web on Jul. 23, 1010 from http://cameochemicals.noaa.gov/reac/98 , 9 pages.*

S.B. Techno-Research "The Newest Trend of Developments in Polyimides", Published in : Jan. 2004, p. 39, Lines 5-8.

J.A. Kreuz; "Hydrolyses of Polyamic-Acid Solutions", Journal of Polymer Science: Part A: Polymer Chemistry, Vol. 28, 3787-3793 (1990).

Osamu Haba, et al; "Positive-Working Alkaline-Developable Photosensitive Polyimide Precursor Based on Poly(amic acid) and Dissolution Inhibitor", Journal of Photopolymer Science and Technology, vol. 10, No. 1 (1997), pp. 55-60.

* cited by examiner

Before imidization      After imidization

POLYIMIDE PRECURSOR, RESIN COMPOSITION COMPRISING THE POLYIMIDE PRECURSOR, PATTERN FORMING METHOD USING THE RESIN COMPOSITION, AND ARTICLES PRODUCED BY USING THE RESIN COMPOSITION

BACKGROUND OF THE INVENTION

1. Field of the Invention

The present invention relates to a polyimide precursor, a resin composition comprising the polyimide precursor, a pattern forming method using the resin composition, and articles produced by using the resin composition.

2. Description of the Related Art

Polyimides are polymers synthesized from diamines and acid dianhydrides. Diamines react with acid dianhydrides in solvent to produce polyamic acids, which are precursors of polyimides and give polyimides through dehydration and ring-closure reaction. In general, since polyimides have poor solubility in solvents and are difficult to process, they are often obtained by making their precursors, which are polyamic acids, into a desired form followed by heating. However, polyimide precursors are often sensitive to heat or water and thus inferior in storage stability (J. A. Kreuz, "J Polym. Sci. Part A: Polym. Chem." vol. 28, 1990, p. 3787). It is known that polyimide precursors (polyamic acids) are generally liable to be hydrolyzed at room temperature, which leads a decrease in molecular weight. This is said to result from the fact that the polyaddition reaction for preparing polyamic acids is an equilibrium reaction. More specifically, in a polyamic acid, cleavage of amino bonds into acid anhydrides and amino groups and their recombination are continuously repeated. Acid anhydride groups thus contained in the system react with moisture in the same system to give a dicarboxylic acid, so that the acid anhydride groups are removed from said equilibrium reaction system, which directs the equilibrium in the direction to cut the amide bonds (in the direction to decrease the molecular weight of the polyamic acid). An improved polyimide was developed in consideration of this point, in which a skeleton excellent in solubility is introduced to a molecular structure thereof so that the polyimide can be easily dissolved in a solvent and formed or applied. However, such a polyimide tends to be inferior in chemical resistance or adhesion to a substrate to the polyimide obtained by the method using a precursor.

Further, a polyimide precursor has been proposed in which carboxyl groups of a polyamic acid are esterified in terms of storage stability (Japanese Patent Application Laid-Open (JP-A) No. Sho. 61-293204). However, this polyamic ester is disadvantageous in that it needs a two-step reaction, purification for removing a condensing agent, and high production costs. In addition, ester bonds are hard to be thermally decomposed; therefore, even after the polyimide precursor is imidized by heat treatment at 300° C. or more to give a polyimide, a thermal decomposition residue derived from ester portions remains in the polyimide, which is responsible for deterioration of properties of the polyimide such as linear thermal expansion coefficient and humidity expansion coefficient.

JP-A Nos. 2002-121382 and 2001-194784 have proposed negative-working photosensitive polyimides produced by the combination of a photoradical generator and a reaction product of a vinyl ether containing photoreactive groups with a polyamic acid. In these inventions, however, since a pattern is formed by cross-linking reaction, the molecular weight of photoreactive portions is increased and decomposed products of the photoreactive portions are likely to remain after imidization. Therefore, these inventions are disadvantageous in that components other than the polyimide remain in a film after imidization, which are responsible for outgassing, etc. Furthermore, they are still disadvantageous in the following respects: gelation is likely to occur upon synthesis and/or during storage because the polyimide contains large amounts of cross-linking components; and portions derived from the vinyl ether is eliminated from the polyamic acid over time, which leads to a decrease in pattern forming ability, because a photoradical generator and a compound containing amino groups, which is a sensitizer of the photoradical generator, are added to the polyamic acid.

JP-A No. 2005-115249 has disclosed a resin composition containing a polyimide precursor in which phenolic hydroxyl groups are each introduced into a carboxyl group of a polyamic acid by an ester bond, a divinyl ether compound having two vinyl ether portions and a thermally decomposable linking group, and a photoacid generator. In the process of forming a film of the resin composition, heat applied to form a film causes a reaction between the phenolic hydroxyl groups and vinyl ethers to form acetal bonds, thereby cross-linking the polyimide precursor. Then, the film is exposed to generate an acid, heated to break the acetal bonds in the exposed portion only, and developed with a basic aqueous solution, thereby obtaining a positive pattern. However, JP-A No. 2005-115249 is disadvantageous in the following respects: it is necessary to add a polymer having a plurality of vinyl ether groups as a cross-linking agent, in a proportion of about 25% based on the whole polyimide precursor; a complicated synthesis process is necessary to introduce phenolic hydroxyl groups into a polyamic acid; and the polyimide precursor is reacted with a vinyl ether to form a film, so that the shape of a pattern, etc., is significantly affected by film forming conditions or the like and thus is susceptible to changes in the process.

SUMMARY OF THE INVENTION

The present invention was made in the light of the circumstances as described above, and it is an object of the present invention to provide a polyimide precursor and a polyimide precursor resin composition, which precursor being easy to synthesize, available at low cost, excellent in storage and capable of giving a polyimide that is low in residual impurities after imidization, irrespective of the chemical structure of the finally-obtained polyimide.

Another object of the present invention is to provide a photosensitive resin composition which is capable of achieving a large dissolution contrast irrespective of the chemical structure of the finally-obtained polyimide and capable of achieving a pattern with excellent shape while keeping a sufficient process margin.

The polyimide precursor of the present invention has repeating units represented by the following formula (1):

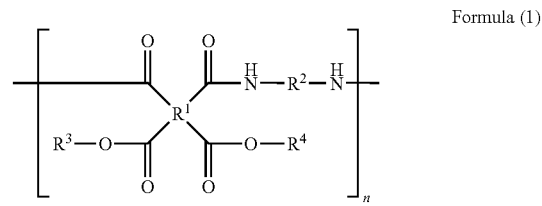

Formula (1)

wherein $R^1$ is a tetravalent organic group; $R^2$ is a divalent organic group; $R^1$s may be the same or different from each other and $R^2$s may be the same or different from each other in the repeating units; $R^3$ and $R^4$ each independently represent a monovalent organic group having a structure represented by the following formula (2) and may be the same or different from each other; and $R^3$s may be the same or different from each other and $R^4$s may be the same or different from each other in the repeating units:

Formula (2)

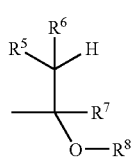

wherein $R^5$, $R^6$ and $R^7$ each independently represent a hydrogen atom, a halogen atom or a monovalent organic group; $R^8$ is a monovalent organic group; $R^8$s may be the same or different from each other in the repeating units; 35 mole % or less of $R_8$s are organic groups having a reactive group; and $R^5$, $R^6$, $R^7$ and $R^8$ may be bonded to each other to form a ring structure.

The polyimide precursor resin composition of the present invention comprises the polyimide precursor of the present invention and a vinyl ether compound.

Further, the photosensitive resin composition of the present invention comprises the polyimide precursor of the present invention and a photoacid generator or comprises the polyimide precursor of the present invention and a photobase generator.

The present invention also provides a pattern forming method comprising an exposure step of irradiating a surface of a film or molded body of the photosensitive resin composition of the present invention with electromagnetic waves in a predetermined pattern, and a developing step of developing either an exposed or unexposed portion with a solvent which is capable of dissolving the exposed or unexposed portion as a developer.

The present invention also provides an article selected from the group consisting of a printed product, a display device, a semiconductor device, electronic parts, an optical member and a building material, at least a part of which article is formed of the polyimide resin composition of the present invention or a cured product thereof.

BRIEF DESCRIPTION OF THE DRAWINGS

In the accompanying drawings.

DESCRIPTION OF THE PREFERRED EMBODIMENT

Figure 1:
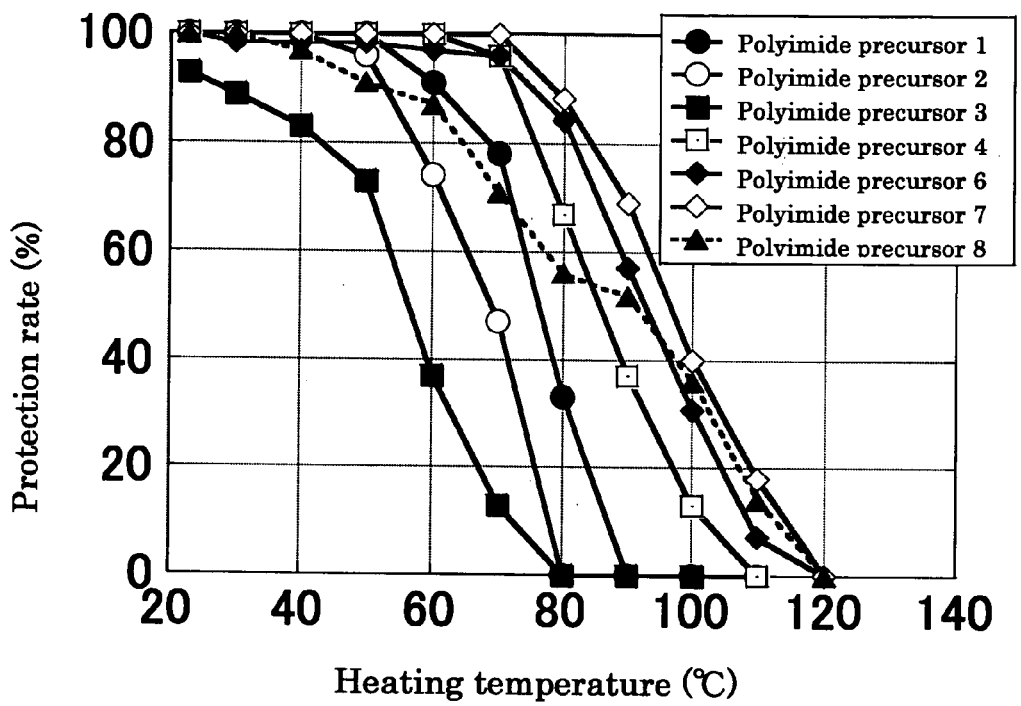
FIG. 1 is a graph showing a relationship between heating temperature and protection rate of each polyimide precursor.

The present invention was made by diligent studies conducted by the inventor who conceived that it would be possible to produce a polyimide which is capable of forming a film containing no residue derived from a carboxyl group-protecting component, by imparting storage stability by hemiacetal esterification of carboxyl groups in a polyamic acid and if, in the course of heating involved in imidization, hemiacetal ester bonds are thermally decomposed to get back into a polyamic acid and the carboxyl group-protecting component is volatilized.

Aromatic hemiacetal ester bonds obtained from a vinyl ether can be decomposed into a polyamic acid and a vinyl ether or acetaldehyde, alcohol, etc., by heating at 180° C. or less. The compounds produced by thermal decomposition of hemiacetal ester bonds are often liquid at room temperature and have a boiling point of 180° C. or less, so that a large portion of each component volatilizes in the course of heating. In many of polyimide precursors, imidization is generally said to proceed by heating and gradually from a temperature of around 140° C., and the glass transition temperature (Tg) of a film increases along with an increase in the rate of imidization. Vibration of molecular chains is suppressed by the increase in Tg, so that it becomes difficult for materials to volatilize from the inside of the film. In the case of hemiacetal ester bonds, however, decomposition of the bonds sometimes takes place at or near room temperature, so that decomposition reaction occurs when the imidization rate is low. Therefore, a combination of hemiacetal ester bonds with a polyimide precursor is characterized by that decomposed components have excellent volatility and, in the course of heating the polyimide precursor to obtain a polyimide, decomposed components are volatilized and almost no decomposed product derived from the hemiacetal ester bonding moieties is left in a polyimide film. Because of this, almost no residue derived from the vinyl ether is left in the finally-obtained polyimide film, thereby achieving a film which is very close to a pure polyimide film.

Among protecting moieties $R^8$s, organic groups having a reactive group are 35 mole % or less. This is preferred because it is possible to prevent a polyimide precursor from gelation upon synthesis or during storage and to reduce the amount of residues in a film.

Said polyimide precursor can be obtained simply by mixing a polyamic acid with a vinyl ether compound and stirring the mixture at room temperature, so that it is available at low cost and very easy to obtain. The reaction between an aromatic carboxylic acid and a vinyl ether compound is somewhat different in behavior from the reaction between an aliphatic carboxylic acid and a vinyl ether compound. The reaction between an aliphatic carboxylic acid and a vinyl ether compound often needs heating or an acid catalyst; however, as a result of diligent studies by the inventor of the present invention, it is possible to cause the reaction only by stirring an aliphatic carboxylic acid and a vinyl ether compound at room temperature. Furthermore, the inventor succeeded in remarkably improving the yield of reaction between a polyamic acid and a vinyl ether compound by using a solvent containing no nitrogen atom at the time of said stirring and also by controlling the reaction temperature. Therefore, the inventor of the present invention has made it possible to completely change the carboxyl groups in an polyamic acid into hemiacetal ester bonds.

It is often the case that polyamic acids, especially aromatic polyamic acids, are dissolved in amide-based highly polar solvents because of their poor solubility. Amide-based solvents, however, have a problem with handling because they have poor volatility and high water absorption. When a highly-concentrated polyamic acid solution absorbs water, a decrease in solubility of the polyamic acid occurs, which leads to precipitation of the polyamic acid.

In contrast with this, the polyimide precursor of the present invention is soluble in relatively less polar solvent because the carboxyl groups are protected by hemiacetal ester bonds. Especially, the polyimide precursor of the present invention shows improved solubility in solvents containing ester bonds. Therefore, the polyimide precursor of the present invention also makes it possible to prepare a highly-concentrated solution for forming a coating film.

I. Polyimide Precursor

The polyimide precursor of the present invention has repeating units represented by the following formula (1):

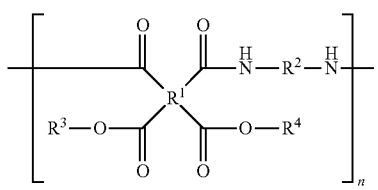

Formula (1)

wherein $R^1$ is a tetravalent organic group; $R^2$ is a divalent organic group; $R^1$s may be the same or different from each other and $R^2$s may be the same or different from each other in the repeating units; $R^3$ and $R^4$ each independently represent a monovalent organic group having a structure represented by the following formula (2) and may be the same or different from each other; and $R^3$s may be the same or different from each other and $R^4$s may be the same or different from each other in the repeating units:

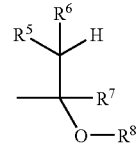

Formula (2)

wherein $R^5$, $R^6$ and $R^7$ each independently represent a hydrogen atom, a halogen atom or a monovalent organic group; $R^8$ is a monovalent organic group; $R^8$s may be the same or different from each other in the repeating units; 35 mole % or less of $R_8$s are organic groups having a reactive group; and $R^5$, $R^6$, $R^7$ and $R^8$ may be bonded to each other to form a ring structure.

In the formula (1), generally, $R^1$ has a tetracarboxylic dianhydride-derived structure and $R^2$ has a diamine-derived structure.

Examples of dianhydrides that may be used in the polyimide precursor of the present invention include ethylenetetracarboxylic dianhydride, butanetetracarboxylic dianhydride, cyclobutanetetracarboxylic dianhydride, cyclopentanetetracarboxylic dianhydride, pyromellitic dianhydride, 3,3',4,4'-benzophenonetetracarboxylic dianhydride, 2,2',3,3'-benzophenonetetracarboxylic dianhydride, 3,3',4,4'-biphenyltetracarboxylic dianhydride, 2,2',3,3'-biphenyltetracarboxylic dianhydride, 2,2',6,6'-biphenyltetracarboxylic dianhydride, 2,2-bis(3,4-dicarboxyphenyl)propane dianhydride, 2,2-bis(2,3-dicarboxyphenyl)propane dianhydride, bis(3,4-dicarboxyphenyl)ether dianhydride, bis(3,4-dicarboxyphenyl)sulfone dianhydride, 1,1-bis(2,3-dicarboxyphenyl)ethane dianhydride, bis(2,3-dicarboxyphenyl)methane dianhydride, bis(3,4-dicarboxyphenyl)methane dianhydride, 2,2-bis(3,4-dicarboxyphenyl)-1,1,1,3,3,3-hexafluoropropane dianhydride, 2,2-bis(2,3-dicarboxyphenyl)-1,1,1,3,3,3-hexafluoropropane dianhydride, 1,3-bis[(3,4-dicarboxy)benzoyl]benzene dianhydride, 1,4-bis[(3,4-dicarboxy)benzoyl]benzene dianhydride, 2,2-bis{4-[4-(1,2-dicarboxy)phenoxy]phenyl}propane dianhydride, 2,2-bis{4-[3-(1,2-dicarboxy)phenoxy]phenyl}propane dianhydride, bis{4-[4-(1,2-dicarboxy)phenoxy]phenyl}ketone dianhydride, bis{4-[3-(1,2-dicarboxy)phenoxy]phenyl}ketone dianhydride, 4,4'-bis[4-(1,2-dicarboxy)phenoxy]biphenyl dianhydride, 4,4'-bis[3-(1,2-dicarboxy)phenoxy]biphenyl dianhydride, bis{4-[4-(1,2-dicarboxy)phenoxy]phenyl}ketone dianhydride, bis{4-[3-(1,2-dicarboxy)phenoxy]phenyl}ketone dianhydride, bis{4-[4-(1,2-dicarboxy)phenoxy]phenyl}sulfone dianhydride, bis{4-[3-(1,2-dicarboxy)phenoxy]phenyl}sulfone dianhydride, bis{4-[4-(1,2-dicarboxy)phenoxy]phenyl}sulfide dianhydride, bis{4-[3-(1,2-dicarboxy)phenoxy]phenyl}sulfide dianhydride, 2,2-bis{4-[4-(1,2-dicarboxy)phenoxy]phenyl}-1,1,1,3,3,3-hexa fluoropropane dianhydride, 2,2-bis{4-[3-(1,2-dicarboxy)phenoxy]phenyl}-1,1,1,3,3,3-propane dianhydride, 2,3,6,7-naphthalenetetracarboxylic dianhydride, 1,4,5,8-naphthalenetetracarboxylic dianhydride, 1,2,5,6-naphthalenetetracarboxylic dianhydride, 1,2,3,4-benzenetetracarboxylic dianhydride, 3,4,9,10-perylenetetracarboxylic dianhydride, 2,3,6,7-anthracenetetracarboxylic dianhydride, 1,2,7,8-phenanthreneteracarboxylic dianhydride, etc.

These examples may be used solely or as a mixture of two or more kinds.

In terms of the heat resistance or linear thermal expansion coefficient of the finally-obtained polyimide film, or in terms of the reactivity of protecting reaction to the precursor preferably used tetracarboxylic dianhydrides are aromatic tetracarboxylic dianhydrides. Particularly preferred tetracarboxylic dianhydrides are pyromellitic dianhydride, mellophanic dianhydride, 3,3',4,4'-benzophenonetetracarboxylic dianhydride, 3,3',4,4'-biphenyltetracarboxylic dianhydride, 2,3,3',4'-biphenyltetracarboxylic dianhydride, 2,3,2',3'-biphenyltetracarboxylic dianhydride, 2,2',6,6'-biphenyltetracarboxylic dianhydride, bis(3,4-dicarboxyphenyl)ether dianhydride, 2,2-bis(3,4-dicarboxyphenyl)-1,1,1,3,3,3-hexafluoropropane dianhydride, and bis(3,4-dicarboxyphenyl)ether dianhydride.

Especially, in terms of the stability of the hemiacetal ester bonds, 3,3',4,4'-biphenyltetracarboxylic dianhydride, 2,3,3',4'-biphenyltetracarboxylic dianhydride, 2,3,2',3'-biphenyltetracarboxylic dianhydride, and bis(3,4-dicarboxyphenyl)ether dianhydride are particularly preferred.

Transparency of the polyimide precursor is increased when an acid dianhydride into which a fluorine is introduced or an acid dianhydride having an alicyclic skeleton structure is used as the concurrent acid dianhydride. Further, the use of a rigid acid dianhydride such as pyromellitic dianhydride, mellophanic dianhydride, 3,3',4,4'-biphenyltetracarboxylic dianhydride, 2,3,3',4'-biphenyltetracarboxylic dianhydride, 2,3,2',3'-biphenyltetracarboxylic dianhydride, and 1,4,5,8-naphthalenetetracarboxylic dianhydride, is preferred because the linear thermal expansion coefficient of the finally-obtained polyimide becomes smaller. Especially, in terms of the stability of the hemiacetal ester bonds, particularly preferred are 3,3',4,4'-biphenyltetracarboxylic dianhydride, 2,3,3',4'-biphenyltetracarboxylic dianhydride, and 2,3,2',3'-biphenyltetracarboxylic dianhydride.

The polyimide precursor is imparted with improved transparency when having an alicyclic skeleton structure as the acid dianhydride, so that the polyimide precursor can give a photosensitive resin composition having high sensitivity. Further, heating or a catalyst is sometimes required for the reaction for forming hemiacetal ester bonds. In this case, it is possible to form hemiacetal ester bonds with relatively high stability, so that this case is preferred when priority is given to storage stability.

On the other hand, the use of an aromatic tetracarboxylic dianhydride enables the polyimide precursor to give a photosensitive resin composition having excellent heat resistance and low linear thermal expansion coefficient. Moreover, since the reaction for forming hemiacetal ester bonds proceeds at room temperature, it is very easy to obtain the intended polyimide precursor. In addition, there is an advantage that since hemiacetal ester bonds decompose at lower temperature, decomposed products are unlikely to remain in a film after imidization. Therefore, in the photosensitive resin composition of the present invention, it is preferred that in the polyimide precursor having the repeating units represented by the formula (1), 33 mole % or more of all $R^1$s have any of the structures represented by the following formula (3):

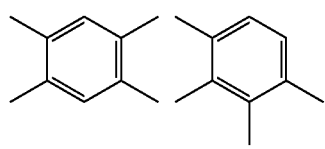

Formula (3)

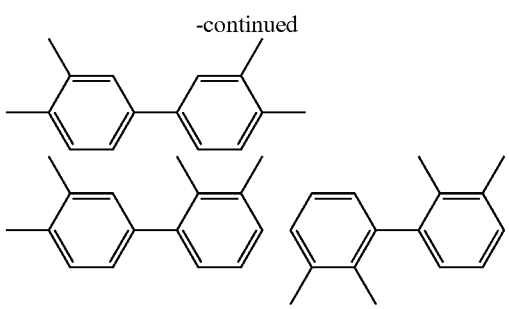

Polyamic acids having the above structures are not only polyimide precursors having high heat resistance and low linear thermal expansion coefficient, but they are also capable of producing hemiacetal ester bonds by the reaction with a vinyl ether compound at room temperature because they contain aromatic carboxylic acids. Moreover, compared to hemiacetal ester bonds obtained from aliphatic carboxylic acids, hemiacetal ester bonds obtained from the above aromatic carboxylic acids can be thermally decomposed by heating at lower temperature, so that they can be decomposed more quickly by heating upon imidization and the amount of vinyl ether-derived decomposed products in the finally-obtained polyimide is small. Therefore, it becomes easier to achieve the objects of the present invention if, among all $R^1$s in the repeating units represented by the formula (1), the content of $R^1$s having any of the structures represented by the formula (3) is closer to 100 mole %. Nevertheless, it is still possible to achieve the objects if the content is at least 33 mole % or more. More specifically, among all $R^1$s in the repeating units represented by the formula (1), the content of $R^1$s having any of the structures represented by the formula (3) is preferably 50 mole % or more, and more preferably 70 mole % or more.

On the other hand, as the diamine component that may be used to produce the polyimide precursor of the present invention, it is possible to use one kind of diamine alone or two kinds of diamines in combination. No particular limitation is imposed on the diamine component used herein, and there may be used p-phenylenediamine, m-phenylenediamine, o-phenylenediamine, 3,3'-diaminodiphenyl ether, 3,4'-diaminodiphenyl ether, 4,4'-diaminodiphenyl ether, 3,3'-diaminodiphenyl sulfide, 3,4'-diaminodiphenyl sulfide, 4,4'-diaminodiphenyl sulfide, 3,3'-diaminodiphenyl sulfone, 3,4'-diaminodiphenyl sulfone, 4,4'-diaminodiphenyl sulfone, 3,3'-diaminobenzophenone, 4,4'-diaminobenzophenone, 3,4'-diaminobenzophenone, 3,3'-diaminodiphenylmethane, 4,4'-diaminodiphenylmethane, 3,4'-diaminodiphenylmethane, 2,2-di(3-aminophenyl)propane, 2,2-di(4-aminophenyl)propane, 2-(3-aminophenyl)-2-(4-aminophenyl)propane, 2,2-di(3-aminophenyl)-1,1,1,3,3,3-hexafluoropropane, 2,2-di(4-aminophenyl)-1,1,1,3,3,3-hexafluoropropane, 2-(3-aminophenyl)-2-(4-aminophenyl)-1,1,1,3,3,3-hexafluoropropane, 1,1-di(3-aminophenyl)-1-phenylethane, 1,1-di(4-aminophenyl)-1-phenylethane, 1-(3-aminophenyl)-1-(4-aminophenyl)-1-phenylethane, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 1,3-bis(3-aminobenzoyl)benzene, 1,3-bis(4-aminobenzoyl)benzene, 1,4-bis(3-aminobenzoyl)benzene, 1,4-bis(4-aminobenzoyl)benzene, 1,3-bis(3-amino-α,α-dimethylbenzyl)benzene, 1,3-bis(4-amino-α,α-dimethylbenzyl)benzene, 1,4-bis(3-amino-α,α-dimethylbenzyl)benzene, 1,4-bis(4-amino-α,α-dimethylbenzyl)benzene, 1,3-bis(3-amino-α,α-ditrifluoromethylbenzyl)benzene, 1,3-bis(4-amino-α,α-ditrifluoromethylbenzyl)benzene, 1,4-bis (3-amino-α,α-ditrifluoromethylbenzyl)benzene, 1,4-bis(4-amino-α,α-ditrifluoromethylbenzyl)benzene, 2,6-bis(3-aminophenoxy)benzonitrile, 2,6-bis(3-aminophenoxy)pyridine, 4,4'-bis(3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 2,2-bis[4-(3-aminophenoxy)phenyl]propane, 2,2-bis[4-(4-aminophenoxy)phenyl]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 1,3-bis[4-(3-aminophenoxy)benzoyl]benzene, 1,3-bis[4-(4-aminophenoxy)benzoyl]benzene, 1,4-bis[4-(3-aminophenoxy)benzoyl]benzene, 1,4-bis[4-(4-aminophenoxy)benzoyl]benzene, 1,3-bis[4-(3-aminophenoxy)-α,α-dimethylbenzyl]benzene, 1,3-bis[4-(4-aminophenoxy)-α,α-dimethylbenzyl]benzene, 1,4-bis[4-(3-aminophenoxy)-α,α-dimethylbenzyl]benzene, 1,4-bis[4-(4-aminophenoxy)-α,α-dimethylbenzyl]benzene, 4,4'-bis[4-(4-aminophenoxy)benzoyl]diphenylether, 4,4'-bis[4-(4-amino-α,α-dimethylbenzyl)phenoxy]benzophenone, 4,4'-bis[4-(4-amino-α,α-dimethylbenzyl)phenoxy]diphenylsulfone, 4,4'-bis[4-(4-aminophenoxy)phenoxy]diphenylsulfone, 3,3'-diamino-4,4'-diphenoxybenzophenone, 3,3'-diamino-4,4'-dibiphenoxybenzophenone, 3,3'-diamino-4-phenoxybenzophenone, 3,3'-diamino-4-biphenoxybenzophenone, 6,6'-bis(3-aminophenoxy)-3,3,3',3'-tetramethyl-1,1'-spirobiindan, 6,6'-bis(4-aminophenoxy)-3,3,3',3'-tetramethyl-1,1'-spirobiindan, 1,3-bis(3-aminopropyl)tetramethyldisiloxane, 1,3-bis(4-aminobutyl)tetramethyldisiloxane, α,ω-bis(3-aminopropyl)polydimethylsiloxane, α,ω-bis(3-aminobutyl)polydimethylsiloxane, bis(aminomethyl)ether, bis(2-aminoethyl)ether, bis(3-aminopropyl)ether, bis(2-aminomethoxy)ethyl]ether, bis[2-(2-aminoethoxy)ethyl]ether, bis[2-(3-aminopropoxy)ethyl]ether, 1,2-bis(aminomethoxy)ethane, 1,2-bis(2-aminoethoxyl)ethane, 1,2-bis[2-(aminomethoxy)ethoxy]ethane, 1,2-bis[2-(2-aminoethoxyl)ethoxy]ethane, ethylene glycol bis(3-aminopropyl)ether, diethylene glycol bis(3-aminopropyl)ether, triethylene glycol bis(3-aminopropyl)ether, ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,2-diaminocyclohexane, 1,3-diaminocyclohexane, 1,4-diaminocyclohexane, 1,2-di(2-aminoethyl)cyclohexane, 1,3-di(2-aminoethyl)cyclohexane, 1,4-di(2-aminoethyl)cyclohexane, bis(4-aminocyclohexyl)methane, 2,6-bis(aminomethyl)bicyclo[2.2.1]heptane, 2,5-bis(aminomethyl)bicyclo[2.2.1]heptane, and the above diamines in which some or all of the hydrogen atoms of aromatic rings are substituted with substituents selected from the group consisting of fluoro groups, methyl groups, methoxy groups, trifluoromethyl groups and trifluoromethoxy groups.

Furthermore, depending on the intended purpose, there may be used the above diamines in which some or all of the hydrogen atoms of aromatic rings are substituted with one or more kinds of substituents selected from the group consisting of ethynyl groups, benzocyclobutene-4'-yl groups, vinyl groups, allyl groups, cyano groups, isocyanate groups and isopropenyl groups, all of which groups act as cross-linking sites.

In the present invention, it is possible to select a diamine depending on desired physical properties. The use of a rigid diamine such as p-phenylenediamine imparts a low expansion coefficient to the finally-obtained polyimide. A diamine in which two amino groups are bonded to one aromatic ring is a rigid diamine, and examples of such a diamine include p-phenylenediamine, m-phenylenediamine, 1,4-diaminonaphthalene, 1,5-diaminonaphthalene, 2,6-diaminonaphthalene, 2,7-diaminonaphthalene, and 1,4-diaminoanthracene.

Further, there may be used a diamine in which two or more aromatic rings are bonded to each other by a single bond, and two or more amino groups are respectively and independently bonded to a different aromatic ring directly or as a part of substituent. Such a diamine is, for example, one represented by the following formula (5) and a specific example thereof is benzidine.

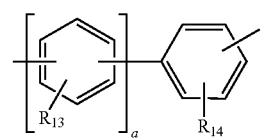

Formula (5)

In the formula (5), "a" is a natural number of 1 or more; each of the amino groups is bonded in the meta- or para-position relative to the bond connecting the benzene rings; and $R^{13}$ and $R^{14}$ are a monovalent organic group or a halogen atom.

Furthermore, there may be used a diamine as shown in the formula (5), which has substituents at certain positions of the benzene rings, which positions are not involved in bonding to other benzene rings and substituted by amino groups. These substituents are monovalent groups and may be bonded to each other.

Specific examples of such a diamine include 2,2'-dimethyl-4,4'-diaminobiphenyl, 2,2'-ditrifluoromethyl-4,4'-diaminobiphenyl, 3,3'-dichloro-4,4'-diaminobiphenyl, 3,3'-dimethoxy-4,4'-diaminobiphenyl, and 3,3'-dimethyl-4,4'-diaminobiphenyl.

A fluorine may be introduced as a substituent of the aromatic ring if the finally-obtained polyimide is intended to be used as an optical waveguide or optical circuit part, so that the finally-obtained polyimide can be imparted with improved transmittance with respect to electromagnetic waves having a wavelength of 1 μm or less.

On the other hand, the use of a diamine having a siloxane skeleton, such as 1,3-bis(3-aminopropyl)tetramethyldisiloxane, can decrease the elastic modulus and thus glass transition temperature of the finally-obtained polyimide.

It is to be noted that the diamine selected herein is preferably an aromatic diamine; however, a non-aromatic diamine such as an aliphatic diamine and a siloxane diamine may be selected depending on a desired physical property, insofar as the amount of the non-aromatic diamine does not exceed 60 mole %, preferably 40 mole % of the whole diamine.

Further, it is preferred that in the polyimide precursor, 33 mole % or more of $R^2$s in the repeating units represented by the formula (1) has any of the structures represented by the following formula (4):

Formula (4)

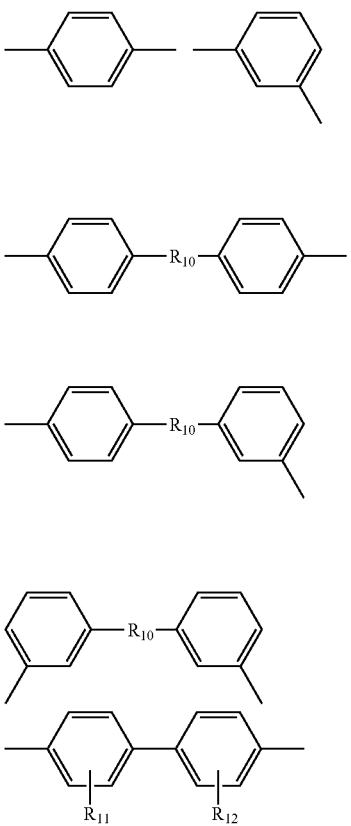

wherein $R^{10}$ is a divalent organic group, an oxygen atom, a sulfur atom or a sulfonic group; and $R^{11}$ and $R^{12}$ are a monovalent organic group or a halogen atom.

Increased heat resistance is imparted to the finally-obtained polyimide when any of the above structures is contained in the polyimide precursor. Therefore, it becomes easier to achieve the objects of the present invention if, among the $R^2$s in the repeating units represented by the formula (1), the content of $R^2$s having any of the structures represented by the formula (4) is closer to 100 mole %. Nevertheless, it is still possible to achieve the objects if the content is at least 33 mole % or more. More specifically, among all $R^2$s in the repeating units represented by the formula (1), the content of $R^2$s having any of the structures represented by the formula (4) is preferably 50 mole % or more, and more preferably 70 mole % or more.

In the formula (1), $R^3$ and $R^4$ each independently represent a monovalent organic group having a structure represented by the following formula (2) and may be the same or different from each other; and $R^3$s may be the same or different from each other and $R^4$s may be the same or different from each other in the repeating units:

Formula (2)

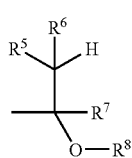

The hemiacetal ester bonds represented by the formula (2) can be obtained by the following reaction of a carboxyl group with a vinyl ether compound, for example:

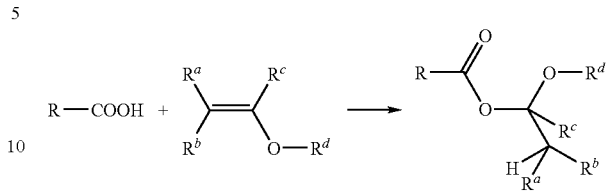

More specifically, in the case of forming the hemiacetal ester bonds by the addition reaction of a carboxylic acid with a vinyl ether compound, $R^5$, $R^6$, $R^7$ and $R^8$ in the formula (2) are determined by the structure of the vinyl ether compound used. The structure represented by the formula (2) may be formed with a cyclic vinyl ether compound such as dihydropyran. In this case, despite poor reactivity and a long reaction time, a polyimide precursor having high heat resistance and excellent thermal stability can be obtained. For a shorter reaction time and improved productivity, it is preferred to use an acyclic vinyl ether compound. It is to be noted that the cyclic vinyl ether is, like 3,4-dihydro-2H-pyran, a vinyl ether having a vinyl bond which constitutes a part of the cyclic structure thereof. For example, despite having a cyclic structure, cyclohexyl vinyl ether and 2-vinyloxytetrahydropyran are classified into acyclic vinyl ethers because a vinyl group thereof does not constitute a part of the cyclic structure. The structure represented by the formula (2) is the portion intended by the present invention to be connected to and then eliminated from the main chain of the polyimide precursor by a hemiacetal ester bond. Accordingly, the structure represented by the formula (2) preferably has a low molecular weight and become highly volatile after decomposition, so that it is possible to reduce the amount of decomposed products remaining in the finally-obtained polyimide film.

In terms of material availability, $R^5$, $R^6$ and $R^7$ are preferably a hydrogen atom, a substituted or unsubstituted alkyl group, allyl group, or aryl group. Among them, a hydrogen atom is particularly preferred. In addition, it is preferred that $R^5$, $R^6$ and $R^7$ contain no substituent having an active hydrogen, such as a primary, secondary or tertiary amino group and a hydroxyl group.

This substituent having an active hydrogen refers to a substituent capable of exchange reaction with the hemiacetal ester bond. Specific examples of the substituent include a hydroxyl group, a primary amino group, a secondary amino group, a tertiary amino group, a carboxyl group and a mercapto group, according to "Kagaku Jiten" (Dictionary of Chemistry) published by Tokyo Kagaku Dozin Co., Ltd.

$R^8$ in the formula (2) is a monovalent organic group having one or more carbon atoms. Examples of $R^8$ include groups having a hydrocarbon skeleton. They may also contain a bond or substituent other than a hydrocarbon, such as a hetero atom, and the hetero atom part may be incorporated into an aromatic ring to form a heterocyclic ring. Examples of the group having a hydrocarbon skeleton include a straight-chain, branched-chain or alicyclic saturated or unsaturated hydrocarbon group; a straight- or branched-chain saturated or unsaturated halogenated alkyl group; an aromatic group such as a phenyl or a naphthyl; a group in which an ether bond is contained in a straight- or branched-chain saturated or unsaturated hydrocarbon skeleton (for example, —(R—O)$_n$—R' wherein R and R' is a substituted or unsubstituted saturated or unsaturated hydrocarbon, and n is an integer of 1 or more; and —R"—(O—R''')$_m$ wherein R" and R''' is a substituted or unsubstituted saturated or unsaturated hydrocarbon, m is an integer of 1 or more, and —(O—R''')$_m$ is bonded to a carbon which is different from a terminal of R"); a group in which a thioether bond is contained in a straight- or branched-chain saturated or unsaturated hydrocarbon skeleton; and various groups comprising a straight- or branched-chain saturated or unsaturated hydrocarbon skeleton to which a hetero atom or a hetero atom-containing group is bonded, examples of which hetero atom and hetero atom-containing group include a halogen atom, a cyano group, a silyl group, a nitro group, an acetyl group, an acetoxy group and a sulfone group. Further, $R^8$ in the formula (2) may be connected to $R^5$ or $R^6$ to form a ring structure.

When a substituent having an active hydrogen such as a primary, secondary or tertiary amino group or a hydroxyl group is contained, the hemiacetal ester bonds become more decomposable and the storage stability of the polyimide precursor is thus decreased. For this reason, it is preferred that $R^8$ in the formula (2) contain no active hydrogen.

Furthermore, the polyimide precursor tends to have poor storage stability when $R^8$ in the formula (2) contains a reactive group such as a reactive ethylenic unsaturated bond. For this reason, even in the case where reactive unsaturated bonds are contained, the content is preferably small; moreover, the repeating units in which a reactive group is contained in $R^8$ in the formula (2) account for 35 mole % or less of all the repeating units represented by the formula (1). It is preferred that $R^8$ in the formula (2) contain substantially no reactive group so as to make decomposed products of $R^8$s produced after cutting the hemiacetal bonds less likely to remain in the finally-obtained polyimide film. Examples of the reactive group include a glycidyl group, an oxetanyl group and an isocyanuric group, in addition to an ethylenic unsaturated bond.

Especially from the viewpoint of adhesion to a substrate, storage stability, resistance to repellent and volatility of decomposed products, $R^8$ in the formula (2) preferably contains an ether bond in the hydrocarbon skeleton. $R^8$ may also contain a polyoxyalkylene skeleton. When a polyoxyalkylene skeleton is contained, the number of repeated oxyalkylenes is preferably 15 or less in terms of volatility of decomposed products.

Hemiacetal ester bonds are decomposed into a carboxylic acid and other products by heating. Generally, the decomposition temperature increases in the following order of carbon atoms which are each bonded at $R^8$ in the formula (2) to the oxygen atom of the ether bond: a tertiary carbon atom (hereinafter it may be simply referred to as "tertiary carbon")<a secondary carbon atom (hereinafter it may be simply referred to as "secondary carbon")<a primary carbon atom (hereinafter it may be simply referred to as "primary carbon").

On the other hand, in the reaction between a vinyl ether compound and a carboxylic acid for obtaining a hemiacetal ester bond, the reactivity generally increases in the following order of carbon atoms which are each bonded at $R^8$ in the formula (2) to the oxygen atom: a primary carbon<a secondary carbon<a tertiary carbon.

In the present invention, it is to be noted that a primary carbon atom is one that is attached to zero or one other carbon atom; a secondary carbon atom is one that is attached to two other carbon atoms; a tertiary carbon atom is one that is attached to three other carbon atoms, regarding the carbon atom which is a constituent of the hemiacetal ester bond and bonded to an ether oxygen atom (the carbon atom bonded at $R^8$ in the formula (2) to the oxygen atom) or the other carbon atom which is bonded to an ether oxygen atombonded to a vinyl group of the vinyl ether compound, which vinyl group derives the hemiacetal ester bond.

Consequently, when the carbon bonded at $R^8$ in the formula (2) to the oxygen atom is a primary carbon, the polyimide precursor is imparted with high stability and can be stored for a longer time. Additionally, the heating temperature in the process of, for example, forming a film can be set higher, which makes the polyimide precursor more stable in the process.

When the carbon bonded at $R^8$ in the formula (2) to the oxygen atom is a tertiary carbon, the polyimide precursor becomes slightly unstable; however, it is possible to the decompose hemiacetal ester bond by heating at a lower temperature. Therefore, decomposition of the hemiacetal ester bonds and volatilization of decomposed products proceed more smoothly in the heating process for imidization, and it is possible to reduce the amount of residual components of protective group-derived decomposed products in the finally-obtained polyimide film by heating for a shorter period. In most cases, the amount can be reduced to substantially zero. The carbon which is bonded at $R^8$ in the formula (2) to the oxygen atom is preferably a tertiary carbon if it is required to obtain the polyimide precursor containing hemiacetal ester bonds in a short reaction time.

When the carbon bonded at $R^8$ in the formula (2) to the oxygen atom is a secondary carbon, it is possible to obtain a photosensitive resin composition which is intermediate in properties between the case of a primary carbon and that of a tertiary carbon, and well-balanced between storage stability of the polyimide precursor, eliminatability of the protective groups and reactivity to the hemiacetal ester bond.

In terms of volatility of the decomposed products, $R^8$ in the formula (2) preferably has 1 to 30 carbon atoms, more preferably 2 to 15 carbon atoms.

In the structure of $R^8$ in the formula (2), $R^8$ is preferably a monovalent C2-C30 organic group containing an ether bond. More preferably, $R^8$ is a monovalent C2-C30 organic group containing an ether bond and not containing an active hydrogen.

No particular limitation is imposed on $R^8$ in the formula (2). Examples of $R^8$ include a methyl group, an ethyl group, an ethynyl group, a propyl group, an isopropyl group, an n-butyl group, a t-butyl group, an n-hexyl group, a cyclohexyl group, a cyclohexylmethyl group, a methoxyethyl group, an ethoxyethyl group, a propoxyethyl group, a butoxyethyl group, a cyclohexyloxyethyl group, a methoxypropyl group, an ethoxypropyl group, a propoxypropyl group, a butoxypropyl group, a cyclohexyloxypropyl group, and a 2-tetrahydropyranyl group. Additionally, examples of $R^8$ include a ring structure in which $R^8$ in the formula (2) is connected to $R^5$ or $R^6$, thereby allowing a substituent corresponding to $R^3$ and/or $R^4$ to form a cyclic ether such as a 2-tetrahydropyranyl group.

$R^8$ in the formula (2) may be a mixture prepared by appropriately combining two or more kinds of protecting moieties each having different chemical structures. As a result of this, stability upon heating or against an acid or basic material is varied depending on the structure of $R^8$. Therefore, it becomes possible to stably control the rate of hemiacetal ester bond decomposition by heating, an acid material or a basic material, or the rate of imidization by heating in the presence of an acid or a base. That is, the decomposability of the hemiacetal ester bonds varies depending on the chemical structures of the protecting moieties. Accordingly, in the case where the polyimide precursor has various types of protecting moieties, it is possible to control the solubility in a developer in stages, corresponding to the introduction rates of the protecting moieties. Therefore, the polyimide precursor can be a material with a wide process margin.

For instance, in the case of using a protecting moiety with high heat resistance and that with low heat resistance in combination, it is possible to selectively decompose the protecting moiety with low heat resistance only, by heating at a temperature which is lower than the decomposition temperature of the protecting moiety with high heat resistance and which is also the same as or higher than the decomposition temperature of the protecting moiety with low heat resistance. In other words, it is possible to selectively decompose the protecting moiety with low heat resistance only, by heating under the condition in which there is a large difference between the decomposition rates of the protecting moieties heated in an identical condition. Consequently, when using two or more kinds of protecting moieties in combination, that is, when $R^8$ in the formula (2) contains two or more kinds of organic groups, the moieties/groups are preferably selected so that, for example, the difference between the decomposition rates of at least two kinds of hemiacetal ester bonds heated in an identical heating condition is 30% or more on the same heating condition, more preferably 50% or more, and still more preferably 70% or more.

An example of said heating condition is the case where a 1 wt % deuterated DMSO solution of the polyimide precursor is heated in a NMR tube or where the solution is applied on a non-alkali glass substrate having a thickness of 800 μm and heated on a hot plate. The decomposition temperature can be measured by, for example, the integral ratio of two hydrogen peaks measured by NMR, the first hydrogen peak being derived from hemiacetal ester bonds and the second being that of amide groups or aromatic rings, or from the integral ratio of vinyl ether-derived peaks observed in an IR spectrum.

As described above, in the case of using a protecting moiety with high heat resistance and a protecting moiety with low heat resistance in combination, it is possible to control the proportion of carboxyl groups left after heating by controlling the introduction rate of the protecting moiety with low heat resistance. In the polyimide precursor, the proportion of carboxyl groups is an important factor in determining a dissolution rate of the precursor in a basic solution, and controlling the proportion of carboxyl groups so as to have sufficient reproducibility makes it possible to stably obtain a pattern with excellent shape, thereby increasing the practicality of the polyimide precursor.

Provided that A1 refers to a group consisting of organic groups in which the carbon atom bonded at $R^8$ in the formula (2) to the oxygen atom is a primary carbon atom; A2 refers to a group consisting of organic groups in which said carbon atom is a secondary carbon atom; and A3 refers to a group of organic groups in which said carbon atom is a tertiary carbon atom, $R^8$ may be a mixture comprising A1 and A2; A1 and A3; A2 and A3; or A1, A2 and A3, and the mixture containing two or more kinds of organic groups by combining one or more kinds of each group in the above combination. As just described, in the case where two or more kinds of organic groups having carbon atoms in different types of classification are contained as $R^8$, there is a relatively large difference between the reactivities of vinyl ether compounds used as raw materials or between the thermal decomposition temperatures of hemiacetal ester bonds. Therefore, it is easy to realize more stable control of the introduction ratios of two or more different types of hemiacetal ester bonds. Further, it is possible to realize more stable control of the decomposition rates of hemiacetal ester bonds by heating.

In general, as described above, high stability is obtained when the carbon bonded at $R^8$ to the oxygen atom is a primary carbon (A1), and the stability decreases in the order of a secondary carbon (A2) and a tertiary carbon (A3). Accordingly, by combining protecting moieties so as to have a primary carbon (A1) and a secondary carbon (A2) and/or a tertiary carbon (A3), protecting moieties can be decomposed selectively and thus stable pattern formation is realized.

$R^8$ in the formula (2) may be a combination of two or more kinds selected from A1s, A2s or A3s. Such a combination may be also used to control the decomposition rate if the structure of $R^8$ is selected so as to appropriately obtain a difference between the decomposabilities of hemiacetal bonds.

The group of organic groups A1 (A1' and A1") in which the carbon atom bonded at $R^8$ to the oxygen atom is a primary carbon atom includes, for example, organic groups represented by the following formulae (6-1) and (6-1'). The group of organic groups A2 in which said carbon atom is a secondary carbon atom includes, for example, organic groups represented by the following formula (6-2). The group of organic groups A3 in which said carbon atom is a tertiary carbon atom includes, for example, organic groups represented by the following formula (6-3).

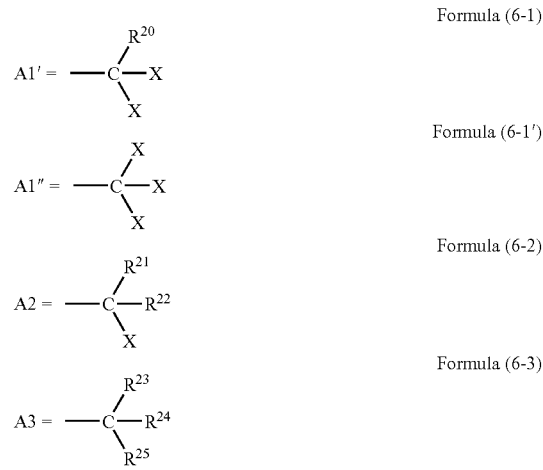

In formulae (6-1) to (6-3), $R^{20}$ to $R^{25}$ are independently a monovalent organic group, and X is independently a hydrogen atom, a halogen atom, an alkoxycarbonyl group, an acyloxy group, a benzoyloxy group which may contain a substituent, an alkylthio group, a phenylthio group which may contain a substituent, or an alkoxy group. $R^{20}$ and X may be bonded to each other to form a ring structure. $R^{21}$, $R^{22}$ and X may be bonded to each other to form a ring structure. $R^{23}$, $R^{24}$ and $R^{25}$ may be bonded to each other to form a ring structure.

In the above formulae (6-1) to (6-3), $R^{20}$ to $R^{25}$ are independently a monovalent organic group and bonded to the carbon atom shown in the formulae (6-1) to (6-3) via a carbon atom. Examples of $R^{20}$ to $R^{25}$ are groups having a hydrocarbon skeleton. Such groups may also contain a bond or substituent other than a hydrocarbon, such as a hetero atom, and the hetero atom may be incorporated into an aromatic ring to form a heterocyclic ring. The groups having a hydrocarbon skeleton may be the same as those disclosed in the above description regarding A.

An example of a ring structure formed by bonding $R^{21}$ and $R^{22}$ to each other is a cyclohexyl group. An example of a ring structure formed by bonding $R^{23}$, $R^{24}$ and $R^{25}$ to each other is an adamantyl group.

Meanwhile, in the above formulae (6-1) to (6-3), X is independently a hydrogen atom, a halogen atom, an alkoxycarbonyl group, an acyloxy group, a benzoyloxy which may contain a substituent, an alkylthio group, a phenylthio group which may contain a substituent, or an alkoxy group. An example of a hydrocarbon group bonded to an alkoxycarbonyl group (—COOR), an acyloxy group (—OCOR) or an alkoxy group (—OR) is a straight-chain, branched-chain or alicyclic saturated or unsaturated hydrocarbon group. The alkoxy group may be bonded to $R^8$ in the formula (2) to form a cyclic ether structure so that $R^8$ becomes a 2-tetrahydropyranyl group.

In terms of easy availability of raw materials, X in the formulae (6-1) to (6-3) is preferably a hydrogen atom or an alkoxy group.

Also, a polyimide precursor into which protecting moieties each having a different chemical structures are introduced can be synthesized by allowing a vinyl ether having two or more kinds of chemical structures to react with a polyamic acid in stages or at once.

Methods for producing the polyimide precursor of the present invention may be conventionally known methods. For example, it maybe, but not limited to, a method in which a polyamide acid, which is a precursor, is synthesized from an acid dianhydride and a diamine and reacted with a vinyl ether compound. Also, there may be a method in which a dicarboxy dihemiacetal ester compound is prepared by reaction of a tetracarboxylic acid with two equivalents of vinyl ether compound, which is then subjected to dehydration-condensation reaction with diamine to produce a polymer.

Said polyimide precursor is generally obtained by reaction of a polyamic acid with a vinyl ether compound. According to the studies by the inventor of the present invention, the reaction has a tendency that the yield of hemiacetal ester bonds is low in a solvent containing an active hydrogen such as an amino group or a hydroxyl group, or in the presence of a compound containing an active hydrogen such as an amino group or a hydroxyl group. Furthermore, the same tendency is observed when using a solvent containing, in a skeleton thereof, a nitrogen atom which is in the form other than a nitro group. In the present invention, therefore, it is not preferred to use solvents containing in their skeletons a nitrogen atom which is in the form other than a nitro group.

In general, polyimides having low linear thermal expansion coefficient are aromatic polyimides. Aromatic polyamic acids are precursors of such polyimides and exhibit high solubility in amide solvents containing a nitrogen atom such as N-methylpyrrolidone or dimethylacetamide. In most cases, however, they exhibit low solubility in solvents containing no nitrogen atom, such as non-amide solvents. Especially, an aromatic polyamic acid which has any of the structures represented by the formula (3) as $R^1$ and any of the structures represented by the formula (5) as $R^2$ respectively and thus is capable of realizing low expansion characteristics, is not completely soluble in non-amide solvents such as lactones and sulfoxides. It is to be noted herein that "not completely soluble" means the state in which a polyamic acid cannot be completely dissolved at a concentration required in the reaction or to form a film, for example, at a concentration of 16.5% by weight in a solvent at 23° C.

According to the conventional technique as JP-A No. 2001-194784, an aromatic polyamic acid is reacted with a vinyl ether compound in the state of being dissolved in an amide solvent. Therefore, by such a conventional art, it is conventionally impossible to synthesize a 100% hemiacetal-esterified polyimide precursor derived from an aromatic polyamic acid, which has any of the structures represented by the formula (3) as $R^1$ and any of the structures represented by the formula (5) as $R^2$ and thus is capable of realizing low expansion characteristics.

In contrast, the present invention has succeeded in producing a polyimide precursor in which 100% of the carboxyl groups in a polyamic acid are changed into hemiacetal ester bonds. The polyimide precursor having hemiacetal ester bonds used in the present invention is imparted with increased solubility by hemiacetal-esterifying the carboxyl groups, so that it exhibits high solubility even in a solvent containing no nitrogen atom, such as a non-amide solvent. Accordingly, an excellent reaction efficiency is obtained when said polyamic acid is reacted with a vinyl ether compound in a solvent containing no nitrogen atom. However, as described above, it is often the case that the polyamic acid which is capable of achieving a polyimide with low linear expansion coefficient is not completely dissolved, initially. The polyimide precursor of the present invention, however, is produced in such a way that the polyimide precursor starts to dissolve in a reaction solvent with the progress of reaction of a polyamic acid with a vinyl ether compound, and it finally dissolved completely. More specifically, in the present invention, it is possible to obtain the polyimide precursor by reaction in one or more kinds of solvents selected from lactones and sulfoxides between a polyamic acid which is not completely soluble in this solvent and a vinyl ether compound.

Because it is possible to produce a polyimide precursor in which 100% of the carboxyl groups of a polyamic acid are changed into hemiacetal ester bonds, among solvents containing no nitrogen atom, a reaction solvent selected from lactones and sulfoxides is preferably used as the reaction solvent used in the reaction between a polyamic acid and a vinyl ether. Examples of lactones include γ-butyrolactone, α-acetyl-γ-butyrolactone, ε-caprolactone, γ-hexanolactone and δ-hexanolactone. Examples of sulfoxides include dimethyl sulfoxide, methyl ethyl sulfoxide, and diethyl sulfoxide. While having high solubility, dimethyl sulfoxide has been found to resist oxidization and be mutagenic and thus has a problem with stability or safety required for a solvent. Accordingly, lactones are particularly preferred.

Because it is possible to produce a polyimide precursor in which 100% of the carboxyl groups in a polyamic acid are changed into hemiacetal ester bonds, the reaction temperature of the reaction between a polyamic acid and a vinyl ether is preferably 5 to 35° C., more preferably 10 to 30° C. At temperatures higher than the range, a side reaction such as decomposition of hemiacetal ester bonds proceeds, which tends to obtain no polyimide precursor in which 100% of the carboxyl groups in a polyamic acid are changed into hemiacetal ester bonds.

The polyimide precursor used in the present invention has high solubility in non-amide solvents having a low boiling point, thereby providing improved handleability in the process of coating, etc.

In the present invention, the vinyl ether compound may be selected appropriately depending on the structure of a desired hemiacetal ester bond. For instance, specific examples of primary vinyl ether compounds capable of deriving said A1 include vinyl ether compounds having a straight- or branched-chain saturated or unsaturated hydrocarbon skeleton, such as methyl vinyl ether, ethyl vinyl ether, n-propyl vinyl ether, n-butyl vinyl ether, n-amyl vinyl ether, octadecyl vinyl ether; vinyl ether compounds having an alicyclic saturated hydrocarbon skeleton, such as cyclohexyl methyl vinyl ether, tricyclodecanyl methyl vinyl ether, pentacyclopentadecanyl methyl vinyl ether; and vinyl ethers in which an ether bond is contained in a straight-chain, branched-chain or alicyclic saturated or unsaturated hydrocarbon, such as ethylene glycol methyl vinyl ether, ethylene glycol ethyl vinyl ether, ethylene glycol propyl vinyl ether, ethylene glycol butyl vinyl ether, polyethylene glycol methyl vinyl ether, polyethylene glycol ethyl vinyl ether, polyethylene glycol propyl vinyl ether, polyethylene glycol butyl vinyl ether, polyethylene glycol octyl vinyl ether, propylene glycol methyl vinyl ether, propylene glycol ethyl vinyl ether, propylene glycol propyl vinyl ether, propylene glycol butyl vinyl ether, polypropylene glycol methyl vinyl ether, polypropylene glycol ethyl vinyl ether, polypropylene glycol propyl vinyl ether, polypropylene glycol butyl vinyl ether, polypropylene glycol octyl vinyl ether, butylene glycol methyl vinyl ether, butylene glycol ethyl vinyl ether, butylene glycol propyl vinyl ether, butylene glycol butyl vinyl ether, polybutylene glycol methyl vinyl ether, polybutylene glycol ethyl vinyl ether, polybutylene glycol propyl vinyl ether, polybutylene glycol butyl vinyl ether, polybutylene glycol octyl vinyl ether, and 2-vinyloxytetrahydropyran. Additionally, said examples include cyclic vinyl ether compound such as 3,4-dihydro-2H-pyran, 2,3-dihydrofuran, 3,4-dihydro-2-methoxy-2H-pyran, and 3,4-dihydro-2-ethoxy-2H-pyran.

Specific examples of secondary vinyl ether compounds capable of deriving said A2 include vinyl ether compounds having a straight- or branched-chain saturated or unsaturated hydrocarbon skeleton, such as isopropyl vinyl ether, sec-butyl vinyl ether, and sec-pentyl vinyl ether; vinyl ether compounds having an alicyclic saturated hydrocarbon skeleton, such as cyclohexyl vinyl ether, tricyclodecanyl vinyl ether, and pentacyclopentadecanyl vinyl ether; and vinyl ethers in which an ether bond is contained in a straight- or branched-chain saturated or unsaturated hydrocarbon skeleton, such as 1-methoxyethyl vinyl ether, 1-ethoxyethyl vinyl ether, 1-methyl-2-methoxyethyl vinyl ether, and 1-methyl-2-ethoxyethyl vinyl ether.

Specific examples of tertiary vinyl ether compounds capable of deriving said A3 include vinyl ether compounds having a straight- or branched-chain saturated or unsaturated hydrocarbon skeleton, such as tert-butyl vinyl ether and tert-amyl vinyl ether; vinyl ether compounds having an alicyclic saturated hydrocarbon skeleton, such as 1-methylcyclohexyl vinyl ether and 1-adamantyl vinyl ether; and vinyl ethers in which an ether bond is contained in a straight- or branched-chain saturated or unsaturated hydrocarbon skeleton, such as 1,1-dimethyl-2-methoxyethyl vinyl ether.

When said primary, secondary and tertiary vinyl ether compounds contain polyoxyalkylene residues, the number of repeated oxyalkylene residues is preferably 15 or less in terms of volatility after decomposition.

The method of producing the polyimide precursor of the present invention may be a novel method of producing a polyimide precursor by polymerizing one or more kinds of acid dianhydrides and one or more kinds of diamines in a solution containing a vinyl ether compound.

Carboxylic acids, especially aromatic carboxylic acids and vinyl ether compounds react with each other when mixed in a non-amide solvent at room temperature, thereby forming hemiacetal ester bonds in good yield. On the other hand, polyamic acids, which are precursors of polyimides having a structure capable of showing high heat resistance and low linear thermal expansion coefficient, have poor solubility in a non-amide solvent such as γ-butyrolactone and cyclopentanone due to chemical structures thereof, and polymerization reaction cannot proceed uniformly. Therefore, it is conventionally impossible to carry out polymerization and hemiacetal esterification of a polyamic acid in an identical solvent system.

As a result of diligent researches, the inventor of the present invention has found out the aforementioned, novel production method.

The polyamic acid with poor solubility in a non-amide solvent can gradually increase its solubility in a non-amide solvent as the reaction with a vinyl ether compound proceeds and carboxyl groups are hemiacetal-esterified. At the point when a certain percentage or more of carboxyl groups are hemiacetal-esterified, the polyamic acid become soluble in a non-amide solvent or mixed solution of a non-amide solvent and a vinyl ether compound.

By using this phenomenon and polymerizing one or more kinds of acid dianhydrides and one or more kinds of diamines in the presence of a vinyl ether compound, a reaction occurs between the acid dianhydrides and diamines to produce carboxyl groups, and part of the reaction products precipitate from the solution. However, carboxyl groups of part of the reaction products dissolved in the solvent react with the vinyl ether compound in the solvent to produce hemiacetal ester bonds, resulting in an increase in solubility. Then, a precipitated amic acid gradually reacts with the vinyl ether compound and gradually dissolves. After the amic acid is totally hemiacetal-esterified, all thereof come to dissolve.

In general, low-molecular-weight polymers are often highly soluble. This tendency is stronger when polymers including repeating units having a highly-polar structure, such as carboxyl groups, are dissolved in a solvent of low polarity.

That is, even in the case of a chemical structure having low solubility in non-amide solvent, the novel production method of the present invention can provide a hemiacetal-esterified polyimide precursor prepared in one pot by promoting a hemiacetal-esterification reaction gradually from the stage of a low-molecular-weight amic acid having relatively high solubility concurrently with carrying out a polymerization reaction.

This production method of polyimide can achieve a given purpose when a vinyl ether compound is contained in a reaction solution in addition to the above-mentioned acid dianhydride and diamine to be polymerized. Depending on a specific purpose, all of the reaction solvent may be a vinyl ether compound. Or, in terms of the solubility of a solute, the reaction solvent may be a mixture of a vinyl ether compound and a solvent other than the vinyl ether compound.

In terms of safety and storage stability, the solution containing a vinyl ether compound preferably contains one or more kinds of solvents selected from lactones and esters.

The content of a vinyl ether compound is preferably 1 to 100% by weight, more preferably 5 to 100% by weight, still more preferably 10 to 100% by weight, with respect to the whole reaction solvent (the total weight of liquid components in the reaction solution except substances which are solid at 25° C., such as diamines and acid dianhydrides). It is particularly preferred that in the case of containing a solvent in addition to a vinyl ether compound, the vinyl ether compound be contained in an amount of 55 parts by weight or more with respect to 100 parts by weight of the solvent, in terms of the reactivity of the polyimide precursor.

This production method of polyimide precursor is preferably carried out in such a manner that the acid dianhydride is dispersed or dissolved in the solution containing a vinyl ether compound, and then the diamine or a solution in which the diamine is dissolved is added thereto for polymerization. In this case, the amount of time that amino groups are present in the reaction solution can be reduced, so that an almost ideal reaction proceeds.

Since the amidation reaction between an acid anhydride and an amino group has a relatively high reaction rate, the amidation reaction is accelerated by the addition of a diamine. It is preferred that the content of a diamine in the reaction solution be smaller than that of an acid dianhydride because, in this case, terminals of an amic acid thus produced by the reaction are acid anhydride groups, so that hemiacetal ester bonds are prevented from decomposition.

In general, acid dianhydrides have low solubility. A possible reaction of an acid dianhydride with a diamine in a non-amide solvent is a reaction of a slightly dissolved acid dianhydride with a diamine in a solvent, or a solid-liquid reaction of a dispersed solid-state acid dianhydride with a diamine solution.

The addition of a diamine by the above procedure leads to the formation of an amic acid, and in most cases, the amic acid is precipitated from the reaction solution. It is presumed that the precipitated amic acid is then gradually hemiacetal-esterified by the vinyl ether compound in the reaction solution and thereby dissolved in the reaction solution, so that polymerization proceeds gradually.

In the case of adding an diamine or diamine solution later, there is no particular limitation imposed on the adding method. If, however, a diamine or diamine solution in required quantity is added all at once, the temperature of the reaction solution may be increased by reaction heat. Accordingly, it is preferred to add an diamine or diamine solution gradually over time or in several batches.

Since hemiacetal-esterification reaction is very sensitive to moisture, it is preferred to carry out the reaction by a method which is capable of preventing ingress of moisture as much as possible. Consequently, rather than adding a solid-state diamine through the opening of a reaction container, it is preferred to dissolve a solid-state diamine in a preliminarily-dehydrated solvent and add the resultant solution in a dropwise manner, so that it is possible to prevent ingress of moisture and easy to control the added amount of the diamine. Furthermore, in terms of preventing side reactions, it is preferred that a moisture content of the solution containing a vinyl ether compound be 1% by weight or less. Additionally, in terms of preventing side reactions, it is preferred for the solution containing a vinyl ether compound to contain substantially no water and active hydrogen other than derived from said acid dianhydride and diamine. It is to be noted that the wording "to contain substantially no" means that the amount of water contained in the solution containing a vinyl ether compound is too small to observe a decrease in reaction yield, which is due to water and an active hydrogen other than derived from said acid dianhydride and diamine.

In the case of adding a diamine solution later, diamine concentration in the solution is appropriately selected, and it is preferably from 0.1 to 50% by weight, more preferably from 1 to 40% by weight.

If diamine concentration is less than 0.1% by weight, the concentration of the reaction solution is diluted, resulting in the possibility that the reaction rate is decreased or no high-molecular-weight polyimide precursor is obtained. If the concentration is more than 50% by weight, a problem arises that subtle control of the added amount of the diamine is difficult.

In the polyimide precursor production method of the present invention, it is also possible to disperse or dissolve a diamine in a solution containing a vinyl ether compound, followed by the addition of an acid dianhydride or other components for polymerization.

As described above, to proceed with an ideal reaction, the method of adding an diamine later is preferred. However, in the case of a reaction system containing an excess of vinyl ether compound, a desired polyimide precursor can be obtained also by the method of adding an acid dianhydride to a diamine solution.

In the above polyimide precursor production method, it is preferred to carry out a reaction in the solution containing a vinyl ether compound at 0 to 45° C. At a reaction temperature of less than 0° C., the reaction rate is significantly decreased, resulting in deteriorated productivity. At a reaction temperature of more than 45° C., side reactions such as thermal decomposition of hemiacetal ester bonds are likely to occur, resulting in a decrease in yield.

The polyimide precursor of the present invention preferably comprises repeating units represented by the formula (1) of 100 mole %, in terms of the storage stability during the period prior to forming a film. If repeating units represented by the formula (1) contain those having a structure provided with a carboxylic acid by cutting the hemiacetal ester bond, decomposition of the hemiacetal ester bonds can proceed easily due to a catalytic effect of the resulting carboxylic acid.

However, even in the case where repeating units represented by the formula (1) contains those having a structure a carboxylic group by cutting the hemiacetal ester bond in some amount, pattern formation is possible. Therefore, the polyimide precursor contained in the photosensitive resin composition of the present invention preferably comprises repeating units represented by the formula (1) of 70 mole % or more, more preferably 90 mole % or more, and still more preferably 98 mole % or more.

Furthermore, if no active hydrogen is contained, repeating units of a polymer such as a polyimide precursor and/or a polybenzoxazole precursor and repeating units represented by the formula (1) may present together in the polyimide precursor of the present invention. To form a pattern with excellent shape, however, repeating units represented by the formula (1) preferably account for at least 25 mole % of all the repeating units contained in the polyimide precursor of the present invention, more preferably 50 mole % or more, still more preferably 70 mole % or more, and particularly preferably 90 mole % or more.

Examples of polyimide precursors, polybenzoxazole precursors and other polymer compounds, all of which containing no active hydrogen, include repeating units of polyamic esters, repeating units of polyamide phenol esters, repeating units of polyamide phenol ethers, polyphenylene ethers, polyphenylenes and polyesters.

In the polyimide precursor of the present invention, in terms of storage stability, it is preferred that terminals of a polymer are each blocked with an acid anhydride group or a structure containing no active hydrogen. For instance, in the case of an amine-terminal polyimide precursor, examples of the method of blocking terminals with an acid hydride group or a structure containing no active hydrogen include an amidation method using acetic anhydride, a method of changing terminals into an amic acid by using an acid anhydride such as phthalic anhydride or 2,3-naphthalic anhydride, etc. When the terminals are aromatic carboxylic acids, even if the terminals have an active hydrogen, they react with a vinyl ether at room temperature for hemiacetal esterification, so that there is no decrease in storage stability in this case.

To have increased sensitivity when made into a photosensitive resin composition and to provide a pattern shape capable of exactly reproducing a mask pattern, the polyimide precursor of the present invention preferably has a transmittance of at least 5% or more, more preferably 15% or more at any of exposure wavelengths when made into a 1 μm-thick film. Polyimide precursors having high transmittance at the exposure wavelengths can produce less loss of irradiated light, resulting in a photosensitive resin composition having high sensitivity.

When made into a 1 μm-thick film and exposed with a high-pressure mercury lamp, which is a general exposing source, the polyimide precursor of the present invention preferably has a transmittance of 5% or more, more preferably 15%, and still more preferably 50% or more for one electromagnetic wave selected from the group consisting of electromagnetic waves having wavelengths of at least 436 nm, 405 nm and 365 nm.

The weight-average or number-average molecular weight of the polyimide precursor is preferably from 3,000 to 1,000,000, more preferably from 5,000 to 500,000, and still more preferably from 7,000 to 100,000, depending on the intended application. If the weight-average or number-average molecular weight of the polyimide precursor is less than 3,000, it is difficult to impart sufficient strength to a coating or film made of the polyimide precursor. Furthermore, after the polyimide precursor is made into a polyimide by heating treatment, etc., low strength is imparted to a film of the polyimide. On the other hand, if the weight-average or number-average molecular weight exceeds 1,000,000, increased viscosity and thereby decreased solubility is imparted to the polyimide precursor, so that it is difficult to obtain a coating or film having a smooth surface and constant thickness.

It is to be noted that the weight-average molecular weight used herein is a molecular weight that can be obtained by known methods, and an example of which is a polystyrene equivalent molecular weight obtained by the gel permeation chromatography (GPC). Furthermore, the number-average molecular weight used herein can be obtained by, for example, a method of obtaining a number-average molecular weight from the integral ratio of two peaks observed in $^1$H-NMR spectra, the first peak being derived from terminal repeating units and the second from non-terminal repeating units.

II. Resin Composition

The resin composition according to the present invention contains the polyimide precursor according to the present invention. In the resin composition of the present invention, two or more kinds of polyimide precursors synthesized separately may be blended and used. In accordance with the purpose, a polyimide precursor synthesized using a primary vinyl ether compound, a polyimide precursor synthesized using a secondary vinyl ether compound and a polyimide precursor synthesized using a tertiary vinyl ether compound may be appropriately mixed and used.

<Polyimide Precursor Resin Composition>

The polyimide precursor resin composition of the present invention comprises the polyimide precursor of the present invention and a vinyl ether compound.

The polyimide precursor resin composition of the present invention contains the vinyl ether compound, thereby, storage stability drastically improves.

When the polyimide precursor is isolated, the polyimide precursor can be hydrolyzed by the action of moisture in the air or the like in a storage process with time, and can gradually change back into a polyamic acid. Particularly, unlike relatively stable aliphatic hemiacetal ester bonds made of aliphatic carboxylic acids and vinyl ether compounds, while a reaction of aromatic hemiacetal ester bonds obtained by a reaction of an aromatic carboxylic acid and a vinyl ether compounds progresses at room temperature by merely mixing the aromatic carboxylic acid and the vinyl ether compound, the aromatic hemiacetal ester bonds are often hydrolyzed by reaction with moisture in the air if the aromatic hemiacetal ester bonds exist alone.

However, if polyimide precursors having a hemiacetal ester bond coexist with vinyl ether compounds, carboxylic acids produced by hydrolysis are hemiacetal esterified again. That is, similarly as polyimide precursors having a hemiacetal ester bond right after synthesis, polyimide precursors in which all carboxyl groups are substantially hemiacetal esterified can be obtained. Therefore, the polyimide precursor of the present invention coexists with the vinyl ether compound, and thereby, has excellent storage stability when the polyimide precursor is used for the resin composition.

Further, if the polyimide precursor coexists with the vinyl ether compound, acetaldehyde produced together with a polyamic acid is hardly oxidized, and hardly becomes acetic acid. In addition, since an alcohol also becomes an acetal compound by an exchange reaction with other hemiacetal ester bonds, as a result, no active hydrogen is contained in the resin composition.

Therefore, if an excess amount of vinyl ether compound is contained in the resin composition with respect to the amount of compounds containing active hydrogens, a polyamic acid formed by reaction with active hydrogens promptly forms the hemiacetal ester bond so that properties of the resin composition are substantially unchanged. Due to such a continuous cycle, moisture which immixes into the resin composition from the air or the like is consumed and the hemiacetal ester bond is reproduced. Thus, the resin composition exhibits excellent solution stability.

The content of the vinyl ether compound is preferably from 1 weight % to 90 weight %, more preferably from 5 weight % to 70 weight %, of the total amount of the polyimide precursor resin composition including a solvent. In addition, if the polyimide precursor resin composition contains a solvent, 55 parts by weight or more of the vinyl ether compound is preferably contained with respect to 100 parts by weight of the solvent from the viewpoint of storage stability of the polyimide precursor. The vinyl ether compound contained in the resin composition of the present invention may serve as the solvent depending on selection of the structure thereof. In that case, a solvent for dissolving, dispersing or diluting the polyimide precursor resin composition may not be contained in the polyimide precursor resin composition.

The more amount of the vinyl ether compound increases, the more excellent storage stability is obtained. On the other hand, in the case of using a polyimide precursor containing particularly many aromatic skeletons, solubility tends to decrease.

Therefore, from the viewpoint of attaining excellent storage stability, the amount of the vinyl ether compound is preferably as much as possible to the extent that a dissolved solid is not precipitated out of the polyimide precursor resin composition.

In addition, it is preferred that the vinyl ether compound used in the synthesis of the polyimide precursor of the present invention is used. However, a vinyl ether compound which is different from the vinyl ether compound used in the synthesis of the polyimide precursor may also be used. Also, a plurality of vinyl ether compounds may coexist. In the case of a photosensitive resin composition containing a polyimide precursor having various types of protecting moieties, a plurality of vinyl ether compounds used in preparation of various types of protecting moieties preferably coexist, from the viewpoint of stabilizing the introduction rate of the protecting moieties. Primary, secondary and tertiary vinyl ether compounds may be appropriately mixed and used.

Since the vinyl ether compound may serve as the solvent depending on the selection thereof, the content of the vinyl ether compound is appropriately selected according to the kind of vinyl ether compound.

In the polyimide precursor resin composition of the present invention, the solid content of the polyimide precursor is preferably from 0.1 weight % to 80 weight %, more preferably from 0.5 weight % to 50 weight %, of the total amount of the resin composition including a solvent, from the viewpoint of film properties of a film to be obtained, particularly, film strength and heat resistance. If the solid content is less than 0.1 weight %, the film thickness of a coating film to be obtained may be thin and following capability to a substrate having convexoconcaves on surfaces may decrease, thereby resulting in uneven coating. On the other hand, if the solid content exceeds 80 weight %, the viscosity of the resin composition increases so that uneven film thickness is likely to occur due to volatilization of the solvent during coating or the like.

In the resin composition of the present invention, the solid content of the polyimide precursor is preferably 30 weight % or more and more preferably 50 weight % or more, with respect to the total solid content of the resin composition excluding the solvent and the vinyl ether compound hereinafter described, from the viewpoint of physical properties of a film to be obtained, particularly, film strength and heat resistance.

<Photosensitive Resin Composition>

The inventor has studied the hemiacetal ester bond of the polyimide precursor in detail and has found that the hemiacetal ester bond is decomposed in the presence of acid or base or decomposed by heating in the presence of acid or base to become a polyamic acid and a vinyl ether, or a polyamic acid, acetaldehyde and an alcohol. Therefore, if the polyimide precursor having the repeating unit represented by the formula (1) and a photoacid or photobase generator are used in combination utilizing such a reaction, the hemiacetal ester bond is broken exclusively in an exposed portion by the effect of generated acid or base, and a difference in dissolving rate can be made in the exposed portion and unexposed portion.

For example, by developing an exposed and unexposed portion, in which the exposed portion exclusively results in an appearance of a polyamic acid soluble in a basic aqueous solution, with a basic aqueous solution, a positive type pattern, in which the unexposed portion remains, can be obtained. On the other hand, while the polyimide precursor easily dissolves in a solvent such as γ-butyrolactone, the polyamic acid hardly dissolves in such a solvent. Hence, by developing the exposed and unexposed portion with a solvent such as γ-butyrolactone after decomposing the hemiacetal ester bond, a negative type pattern, in which the exposed portion remains, can be also obtained.

In addition, by controlling exposure conditions and an environment upon exposure, conditions and an environment of heating after exposure and so on, imidization of the polyimide precursor can proceed at the same time as decomposition of the hemiacetal ester bond. In this case, the polyimide precursor in the exposed portion partially becomes the polyimide, which has poor solubility, so that a negative type pattern can be obtained by developing the unexposed portion with a solvent.

In the present invention, both positive image and negative image can be obtained by changing process conditions and a developer being used. In this way, the photosensitive resin composition of the present invention can achieve a large dissolution contrast irrespective of the chemical structure of a polyimide to be finally obtained, and, as a result, a pattern with excellent shape can be achieved while keeping a sufficient process margin.

Since the photoacid or photobase generator in the photosensitive resin composition of the present invention catalytically accelerates decomposition of the hemiacetal ester bond, it is possible to obtain a pattern with the use of a small amount of acid or base. More specifically, the photosensitive resin composition of the present invention having the hemiacetal ester bonds and the photoacid or photobase generator in combination can reduce the added amount of the photoacid or photobase generator, which is expensive per unit weight, thereby, cost can be reduced. Furthermore, the photosensitive resin composition of the present invention is highly sensitive. Further, the amount of residue of components derived from the photobase generator in a cured film (polyimide film) to be finally obtained can be reduced.

Also, the inventor has studied the hemiacetal ester bond of the polyimide precursor in detail and has found that, by heating at relatively low temperature, the hemiacetal ester bond dissociates into a polyamic acid and a vinyl ether compound, or is hydrolyzed into a polyamic acid and a vinyl ether, or a polyamic acid, acetaldehyde and an alcohol. Therefore, utilizing such a reaction, the polyimide precursor having the repeating unit represented by the formula (1) can partially or completely be an amic acid structure by causing the above dissociation or hydrolysis reaction by heating the polyimide precursor having the repeating unit represented by the formula (1) under moderate conditions. An amic acid portion has a carboxyl group and exhibits high solubility in a basic solution, and it is possible to change the proportion of changing a hemiacetal ester portion into the amic acid portion by appropriately controlling heating conditions. If the polyimide precursor in which solubility in such a basic solution is controlled and a compound which particularly generates a carboxylic acid by the action of light among photoacid generators are used in combination, the exposed portion dissolves in the basic solution since a carboxyl group is generated to increase hydrophilicity of the exposed portion, while the unexposed portion does not dissolve in the basic solution since the unexposed portion remains hydrophobic. Thereby, the positive type pattern, in which the unexposed portion remains, can be obtained.

In this way, the photosensitive resin composition of the present invention can achieve a large dissolution contrast irrespective of the chemical structure of a polyimide to be finally obtained, and, as a result, a pattern with excellent shape can be achieved while keeping a sufficient process margin, by controlling solubility of the polyimide precursor in the basic solution using a simple means of heating.

A first photosensitive resin composition according to the present invention comprises the polyimide precursor according to the present invention and the photoacid generator.

By using the photoacid generator, a photosensitive resin composition having high sensitivity can be obtained since there are many kinds of commercially available photoacid generators so that the range of options to select photoacid generators and highly sensitive photoacid generators can be selected. In addition, by heating after exposure to generate an acid, it is possible for some kinds of photoacid generators to have a chemical amplification mechanism, in which the generated acid decomposes undecomposed photoacid generators and further produces acid. In this case, a photosensitive resin composition having higher sensitivity can be obtained.

As the photoacid generator of the present invention, any of known photoacid generators may be used without any particular limitation if the photoacid generators decompose and generate an acid by absorbing electromagnetic waves. As the photoacid generator used in the present invention, a compound which itself causes a reaction such as decomposition or intramolecular rearrangement due to exposure of electromagnetic waves, and changes from neutral to acid is suitably used. The photoacid generator may be used alone or in combination of two or more kinds. In the present invention, the electromagnetic waves may be ones which are capable of causing a decomposition reaction in a molecule of a compound, which include not only electromagnetic waves of wavelength in visible or non-visible region but also particle beams such as electron beams, and radiations or ionizing radiations, which collectively refer to the electromagnetic waves and the particle beams.

Examples of a photoacid generator which generates an acid other than a carboxylic acid are iodonium salts such as diphenyliodonium sulfonate, sulfonium salts such as triphenyl sulfonium triflate, benzyl esters such as o-nitrobenzyl sulfonate, acetic acid o-nitrobenzyl acetate, phenyl sulfonate esters such as 1,2,3-tris(sulfonyloxy)benzene, N-imide sulfonates such as N-phthalimide tosylate and succinimide sulfonate, diazodisulfones such as dicyclohexyl diazodisulfone, halomethyls such as bis trichloro methyl phenyl triazine, disulfones such as diphenyldisulfone, oxime sulfonate, keto sulfone compounds and α-keto sulfonates.

On the other hand, among photoacid generators, as a compound which generates a carboxylic acid by the action of light, it is preferred to use a compound having an o-quinone diazide group. The compound having an o-quinone diazide group has a large difference in hydrophobicity and hydrophilicity before and after exposure, thus, a large solubility contrast can be obtained. Also, the compound having an o-quinone diazide group has characteristics of being applicable to wide range of light source due to having high sensitivity and wide absorption band of light. Further, the compound can be easily obtained since various kinds of structures are commercially available. If the polyimide precursor having the repeating unit represented by the formula (1) and the compound having an o-quinone diazide group are used in combination, a highly-sensitive and low-cost photosensitive resin composition can be obtained.

Examples of the compound having an o-quinone diazide group include o-benzoquinone diazide sulfonic acid ester or sulfonic acid amide, o-naphthoquinone diazide-4-sulfonic acid ester or sulfonic acid amide, and o-naphthoquinone diazide-5-sulfonic acid ester or sulfonic acid amide. The compound having an o-quinone diazide group can be obtained, for example, by a condensation reaction of any of o-quinone diazide sulfonyl chlorides and a hydroxy compound, an amino compound or the like in the presence of a dehydrochlorination agent.

Examples of the o-quinone diazide sulfonyl chlorides to be used include benzo quinone-1,2-diazide-4-sulfonyl chloride, naphthoquinone-1,2-diazide-5-sulfonyl chloride and naphthoquinone-1,2-diazide-4-sulfonyl chloride, but are not necessarily limited thereto.

As a compound which reacts with the o-quinone diazide sulfonyl chlorides, the hydroxy compound is preferred from the viewpoint of photosensitive property. Examples of the hydroxy compound to be used include hydroquinone, resorcinol, pyrogallol, bisphenol A, bis(4-hydroxyphenyl)methane, 2,2-bis(4-hydroxyphenyl)hexafluoropropane, 2,3,4-trihydroxy benzophenone, 2,3,4,4'-tetrahydroxy benzophenone, 2,2',4,4'-tetrahydroxy benzophenone, 2,3,4,2',3'-pentahydroxy benzophenone, 2,3,4,3',4',5'-hexahydroxy benzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethylindeno[2,1-a]indene, tris(4-hydroxyphenyl)methane and tris(4-hydroxyphenyl)ethane. The hydroxy compound to be used is not necessarily limited thereto.

In addition, examples of the amino compound to be used include p-phenylenediamine, m-phenylenediamine, 4,4'-diamino diphenyl ether, 4,4'-diaminodiphenylmethane, 4,4'-diaminodiphenyl sulfone, 4,4'-diaminodiphenyl sulfide, o-aminophenol, m-aminophenol, p-aminophenol, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, bis(3-amino-4-hydroxyphenyl)hexafluoropropane and bis(4-amino-3-hydroxyphenyl)hexafluoropropane. The amino compound to be used is not necessarily limited thereto.

As the polyimide precursor which is used in combination with the compound which generates a carboxylic acid by the action of light, it is preferred to use the polyimide precursor in which solubility in a basic solution is controlled in such a manner that the proportion of changing the hemiacetal ester portion into the amic acid portion is changed by appropriately controlling heating conditions. From this viewpoint, in the polyimide precursor of the present invention, it is preferred that $R^8$ in the formula (2) contains two or more kinds of organic groups. More specifically, provided that A1 refers to a group consisting of organic groups in which the carbon atom bonded at $R^8$ in the formula (2) to the oxygen atom is a primary carbon atom; A2 refers to a group consisting of organic groups in which said carbon atom is a secondary carbon atom; and A3 refers a group of organic groups in which said carbon atom is a tertiary carbon atom in the polyimide precursor, $R^8$ may be a mixture comprising A1 and A2; A1 and A3; A2 and A3; or A1, A2 and A3, and the mixture containing two or more kinds of organic groups by combining one or more kinds of each group in the above combination. By making the protecting moieties introduced from the hemiacetal ester bonds into two or more kinds of protecting moieties having different decomposition temperature, it becomes possible to selectively control the rate of decomposition of the hemiacetal ester bonds and to form more stably a pattern.

The amount of the photoacid generator is preferably from 0.005 weight % to 20 weight % of the total amount of the photosensitive resin composition including a solvent, from the viewpoint of sensitivity. Also, from 0.01 weight % to 30 weight % of the photoacid generator which generates an acid other than a carboxylic acid is preferably contained in the photosensitive resin composition of the present invention with respect to the total solid content excluding a solvent and the vinyl ether compound hereinafter described in the photosensitive resin composition from the viewpoint of sensitivity, and from 0.1 weight % to 10 weight % is more preferably contained from the viewpoint of reducing the amount of decomposed products derived from the photoacid generator after imidization. On the other hand, from 0.01 weight % to 45 weight % of the compound which generates a carboxylic acid by the action of light is preferably contained with respect to the total solid content excluding a solvent and the vinyl ether compound hereinafter described in the photosensitive resin composition from the viewpoint of sensitivity, and from 0.1 weight % to 35 weight % is more preferably contained from the viewpoint of reducing the amount of decomposed products derived from the compound which generates a carboxylic acid by the action of light after imidization. Particularly, from the viewpoint of outgassing, smaller amount of the photoacid generator is more desirable.

On the other hand, a second photosensitive resin composition according to the present invention comprises the polyimide precursor of the present invention and the photobase generator.

Particularly, base is preferred from the viewpoint of exhibiting high reliability, particularly high insulating reliability, for applications which involve contact with metal since base does not cause corrosion of metal.

As the photobase generator of the present invention, any of known photobase generators may be used without any particular limitation if the photobase generators decompose and generate base by absorbing electromagnetic waves. As the photobase generator used in the present invention, a compound which itself causes a reaction such as decomposition or intramolecular rearrangement due to exposure of electromagnetic waves, and changes from neutral to basic, generally a compound which generates a primary, secondary, or tertiary amine, is suitably used. The photobase generator may be used alone or in combination of two or more kinds.

Examples of a nonionic photobase generator include nitrobenzyl urethane-based compounds such as N-{[(4,5-dimethoxy-2-nitrobenzyl)oxy]carbonyl}-di-isopropylamine, N-{[(4,5-dimethoxy-2-nitrobenzyl)oxy]carbonyl}-bis(3-pentyl)amine, N-{[(4,5-dimethoxy-2-nitrobenzyl)oxy]carbonyl}-bis(4-heptyl)amine, N-{[(4,5-dimethoxy-2-nitrobenzyl)oxy]carbonyl}-dicyclopropylamine, N-{[(4,5-dimethoxy-2-nitrobenzyl)oxy]carbonyl}-dicyclobutylamine, N-{[(4,5-dimethoxy-2-nitrobenzyl)oxy]carbonyl}-dicyclopentylamine, N-{[(4,5-dimethoxy-2-nitrobenzyl)oxy]carbonyl}-dicyclohexylamine, N-{[(4,5-dimethoxy-2-nitrobenzyl)oxy]carbonyl}-2,6-dimethylpiperidine, N-{[(4,5-dimethoxy-2-nitrobenzyl)oxy]carbonyl}-2,6-dimethylpyrrolidine, N-{[(4,5-dimethoxy-2-nitrobenzyl)oxy]carbonyl}-2,6-dimethyl-4-methyl-piperazine, N-{[(4,5-dimethoxy-2-nitrobenzyl)oxy]carbonyl}-2,6-dimethylmorpholine, N-{[(4,5-dimethoxy-2-nitrobenzyl)oxy]carbonyl}-2,6-dimethylthiomorpholine, N-{[(3,4-dimethoxy-2-nitrobenzyl)oxy]carbonyl}-2,6-dimethylpiperidine, N-{[(3,5-dimethoxy-2-nitrobenzyl)oxy]carbonyl}-2,6-dimethylpiperidine, N-{[(3,6-dimethoxy-2-nitrobenzyl)oxy]carbonyl}-2,6-dimethylpiperidine, N-{[(4,6-dimethoxy-2-nitrobenzyl)oxy]carbonyl}-2,6-dimethylpiperidine, and N-{[(5,6-dimethoxy-2-nitrobenzyl)oxy]carbonyl}-2,6-dimethylpiperidine; acyloxy imino ester-based compounds such as acetophenone oxime benzoate, acetophenone oxime valerate, acetophenone oxime phenylacetate, benzophenone oxime benzoate, benzophenone oxime valerate, and benzophenone oxime benzoate; coumaric amide and derivatives thereof.

Examples of an ionic photobase generator include quaternary ammonium salts with halogen ion, and quaternary ammonium salts with other anion such as thiocyanate ion and tetraphenyl borate ion.

The amount of the photobase generator is preferably from 0.005 weight % to 20 weight % of the total amount of the photosensitive resin composition including a solvent, from the viewpoint of sensitivity. Also, from 0.01 weight % to 30 weight % of the photobase generator is preferably contained in the photosensitive resin composition of the present invention with respect to the total solid content excluding a solvent and the vinyl ether compound hereinafter described in the photosensitive resin composition from the viewpoint of sensitivity, and from 0.1 weight % to 10 weight % is more preferably contained from the viewpoint of reducing the amount of decomposed products derived from the photobase generator after imidization. Particularly, from the viewpoint of outgassing, smaller amount of the photobase generator is more desirable.

The photoacid or photobase generator used in the present invention preferably has absorption in at least one electromagnetic wave having the wavelength selected from 436 nm, 405 nm and 365 nm. The polyimide precursor contained in the photosensitive resin composition generally has a strong absorption in the wavelength of 330 nm or less. Therefore, it is preferred that the photoacid or photobase generator contained in the photosensitive resin composition generates acid or base by the action of light in the wavelength region that the polyimide precursor easily transmits, and has absorption in the wavelength region of 330 nm or more. Further, it is preferred that the photoacid or photobase generator has absorption in at least one light having the wavelength selected from 436 nm, 405 nm and 365 nm, which have high strength among emission wavelengths of high pressure mercury lamp being a light source generally used in exposure. It is particularly preferred that the photoacid or photobase generator has absorption in the wavelength selected from 436 nm and 405 nm.

In addition, specifically, the photoacid or photobase generator used in the present invention preferably has a molar absorbance coefficient of 1 or more, more preferably 10 or more, and still more preferably 50 or more, in any of wavelengths of at least 365 nm or more.

Further, from the viewpoint of reducing the amount of decomposed products derived from the photoacid or photobase generator remaining in a film after imidization, the rate of weight loss by heating at 400° C. of the polyimide obtained from the resin composition is preferably 50% or less, more preferably 30% or less, and still more preferably 10% or less, under nitrogen atmosphere.

Particularly, in the case of reducing the amount of decomposition residue remaining in the polyimide, the rate of weight loss by heating at 300° C. of the polyimide obtained from the resin composition is preferably 50% or less, more preferably 30% or less, and still more preferably 10% or less, under nitrogen atmosphere.

The first and second photosensitive resin compositions according to the present invention preferably contain the aforementioned vinyl ether compound from the viewpoint of drastically improving storage stability.

In the first and second photosensitive resin compositions of the present invention, the solid content of the polyimide precursor is preferably from 0.1 weight % to 80 weight %, more preferably from 0.5 weight % to 50 weight %, of the total amount of the photosensitive resin composition including a solvent, from the viewpoint of film properties of a pattern to be obtained, particularly, film strength and heat resistance. If the solid content is less than 0.1 weight %, the film thickness of a coating film to be obtained may be thin and following capability to a substrate having convexoconcaves on surfaces may decrease, thereby resulting in uneven coating. On the other hand, if the solid content exceeds 80 weight %, the viscosity of the resin composition increases so that uneven film thickness is likely to occur due to volatilization of the solvent during coating or the like.

In the photosensitive resin composition of the present invention, the solid content of the polyimide precursor is preferably 30 weight % or more and more preferably 50 weight % or more, with respect to the total solid content of the photosensitive resin composition excluding a solvent and the vinyl ether compound hereinafter described in the photosensitive resin composition, from the viewpoint of film properties of a pattern to be obtained, particularly, film strength and heat resistance.

<Common Characteristics of Resin Composition>

The resin composition containing the polyimide precursor according to the present invention (polyimide precursor resin composition and photosensitive resin composition) preferably has the following common characteristics.

It is preferred that the resin composition of the present invention contains no active hydrogen and no compound having an active hydrogen. Particularly, it is preferred that the resin composition contains no water. If these components are contained in the resin composition, the hemiacetal ester bond gradually decomposes and storage stability decreases.

If the hemiacetal ester bond coexists with a compound having an active hydrogen such as a hydroxyl group, an exchange reaction between the hemiacetal ester bond and the active hydrogen may be caused. Since the hemiacetal bond is generally more stable than the hemiacetal ester bond, if the polyimide precursor and a compound containing a hydroxyl group coexist, the hemiacetal ester bond is consumed by the hydroxyl group, and a polyamic acid is produced. That is, if the polyimide precursor coexists with the compound having an active hydrogen such as a hydroxyl group, stability of the polyimide precursor decreases. The rate of decomposition reaction of the hemiacetal ester bond varies depending on the chemical structure thereof, and there is a tendency that the faster the rate of reaction producing the hemiacetal ester bond is, the faster the rate of decomposition is.

In addition, from the viewpoint of attaining excellent storage stability, the content of water in the resin composition is preferably 1 weight % or less, more preferably 0.1 weight % or less. Further, the resin composition substantially containing no water is most preferable. Herein, "substantially containing no water" means that the content of water in the composition is low to the extent that decrease of storage stability due to water cannot be observed. Specifically, it means the state in which percentage of the water content in the composition is about less than 0.005 weight %, further less than 0.001 weight %.

Further, the hydrolysis of the hemiacetal ester bond catalytically proceeds in the presence of acid or base. Therefore, since no acid or basic material is substantially contained in the resin composition, storage stability of the polyimide precursor of the present invention containing 100% of hemiacetal ester bonds can be improved. If acid or basic materials are contained in the resin composition, the polyimide precursor decomposes to give a polyamic acid, and further, molecular weight tends to decrease.

Herein, "substantially containing no acid or basic material" means that the content of acid or basic materials in the composition is low to the extent that decrease of storage stability due to acid or basic materials cannot be observed. Specifically, it means the state in which the content percentage of acid or basic materials in the composition is about less than 0.005 weight %, further less than 0.001 weight %.

As a solvent for dissolving, dispersing or diluting the resin composition, any of various types of general-purpose solvents can be used. Alternatively, the reaction solvent when the polyimide precursor is prepared can be used without any change. The solvent may be used alone or in combination of two or more kinds. However, to improve storage stability of the resin composition, it is preferred to use a solvent containing no active hydrogen. Further, a solvent containing no nitrogen atom such as an amide bond in a skeleton is preferred for the same purpose. In addition, it is preferred that a solvent containing a nitrogen atom is not contained.

Also, a solution obtained from the synthesis reaction of the polyimide precursor may be used without any change, or other components may be mixed thereto, if required.

Examples of available general-purpose solvents are ethers such as diethyl ether, tetrahydrofuran, dioxane, ethylene glycol dimethyl ether, ethylene glycol diethyl ether, propylene glycol dimethyl ether, and propylene glycol diethyl ether; ketones such as methyl ethyl ketone, acetone, methyl isobutyl ketone, cyclopentanone, and cyclohexanone; esters such as ethyl acetate, butyl acetate, n-propyl acetate, i-propyl acetate, n-butyl acetate, i-butyl acetate, acetic acid ester of the glycol monoethers (for example, methyl cellosolve acetate, and ethyl cellosolve acetate), methoxy propyl acetate, ethoxy propyl acetate, dimethyl oxalate, methyl lactate, and ethyl lactate; halogenated hydrocarbons such as methylene chloride, 1,1-dichloroethane, 1,2-dichloroethylene, 1-chloropropane, 1-chlorobutane, 1-chloropentane, chlorobenzene, bromobenzene, o-dichlorobenzene, and m-dichlorobenzene; lactones such as γ-butyrolactone; sulfoxides such as dimethyl sulfoxide; and other organic polar solvents. Further, examples are aromatic hydrocarbons such as benzene, toluene and xylene, and other organic nonpolar solvents. These solvents are used alone or in combination.

Among the above, it is preferred to use lactones or sulfoxides, from the viewpoint of being able to prepare a highly-concentrated solution having high storage stability and excellent solubility.

The resin composition of the present invention may be a simple mixture merely made of the polyimide precursor, the above-mentioned essential components and a solvent, if required. The resin composition may be prepared by appropriately compounding other components such as surfactants.

Various organic or inorganic low molecular or polymer compounds may be compounded besides the above, in order to impart process property or various functionalities to the resin composition of the present invention unless the object and effect of the present invention are impaired. For example, dyes, surfactants, leveling agents, plasticizers, microparticles and so on may be used. The microparticles may include organic microparticles such as polystyrene and polytetrafluoroethylene, and inorganic particles such as colloidal silica, carbon and phyllosilicate, which may be porous or have a hollow structure. Examples of the function or form of these microparticles include pigments, fillers and fibers.

In the photosensitive resin composition of the present invention, addition of a sensitizer may be effective in order to improve sensitivity by the photoacid or photobase generator being sufficiently able to utilize the energy of electromagnetic waves of the wavelength that the polyimide precursor transmits.

Particularly, in the case that the polyimide precursor also has absorption in the wavelength of 360 nm or more, the effect of addition of the sensitizer is large. Specific examples of compounds called sensitizers include thioxanthone, diethyl thioxanthone and derivatives thereof, coumarins and derivatives thereof, ketocoumarin and derivatives thereof, ketobiscoumarin and derivatives thereof, cyclopentanone and derivatives thereof, cyclohexanone and derivatives thereof, thiopyrylium salt and derivatives thereof, and thioxanthenes xanthenes, and derivatives thereof. However, it is preferred that an active hydrogen group is not contained in these compounds from the viewpoint of storage stability of the photosensitive resin composition.

Specific examples of coumarin, ketocoumarin and derivatives thereof include 3,3'-carbonyl biscoumarin, 3,3'-carbonyl bis(5,7-dimethoxycoumarin), and 3,3'-carbonyl bis(7-acetoxy coumarin).

Specific examples of thioxanthone and derivatives thereof include diethyl thioxanthone, and isopropylthioxanthone.

Further, other examples include benzophenone, acetophenone, phenanthrene, 2-nitrofluorene, 5-nitroacenaphthene, benzoquinone, 2-ethyl anthraquinone, 2-tert-butylanthraquinone, 1,2-benzanthraquinone, and 1,2-naphthoquinone.

Since the sensitizer exhibits particularly excellent effect by using in combination with the photoacid or photobase generator, a sensitizer which exhibits optimum sensitization action is appropriately selected depending on a structure of the photoacid or photobase generator.

The compounding ratio of other optional components is appropriately selected depending on properties of the optional components and is not particularly limited. The compounding ratio is preferably from 0.1 weight % to 30 weight % with respect to the total solid content excluding the solvent and the vinyl ether compound in the resin composition. If the ratio is less than 0.1 weight %, it is difficult to exhibit the effect of added additives. If the ratio exceeds 30 weight %, it is difficult to reflect the characteristics of the resin cured product finally obtained on an end product.

The resin composition of the present invention can be used for various coating processes or molding processes to produce a film or a three-dimensional molded body.

The polyimide obtained from the resin composition of the present invention contains a small amount of decomposition residues derived from protecting components since eliminatability of hemiacetal esterified site of the precursor is excellent. Therefore, the polyimide also keeps original properties such as heat resistance, dimensional stability and insulation, which are excellent.

For example, the 5% loss in weight temperature of the polyimide obtained from the resin composition of the present invention measured under nitrogen atmosphere is preferably 250° C. or more, more preferably 300° C. or more. Particularly, in the case that the polyimide obtained from the resin composition of the present invention is used for applications such as electronic components, the production method of which includes a solder reflow process, if the 5% loss in weight temperature is 300° C. or less, there is a risk that defects such as bubbles may occur due to cracked gas generated in the solder reflow process.

Herein, the 5% loss in weight temperature means a temperature at which weight of a sample is reduced by 5% of an initial weight (that is to say, a temperature at which the weight of the sample is reduced to 95% of the initial weight) when a weight decrement is measured by means of the thermogravimetric analyzer. Similarly, a 10% loss in weight temperature means a temperature at which weight of a sample is reduced by 10% of an initial weight.

The glass transition temperature of the polyimide obtained from the resin composition of the present invention is preferably 260° C. or more from the viewpoint of heat resistance. The glass transition temperature is important for electronic members which include a solder reflow process. In applications which may include a thermoforming process such as an optical waveguide, the glass transition temperature is preferably about 120° C. to 400° C., more preferably about 200° C. to 370° C.

Herein, if the polyimide obtained from the resin composition can be formed into a film, the glass transition temperature in the present invention can be obtained from a peak temperature of tan δ (tan δ=loss elastic modulus (E″)/storage elastic modulus (E')) by a dynamic viscoelasticity measurement. The dynamic viscoelasticity measurement can be conducted by, for example, a viscoelasticity analyzer (product name: Solid Analyzer RSA II, manufactured by Rheometric Scientific Inc.) at a frequency of 1 Hz and a heating rate of 5° C./min. If the polyimide obtained from the resin composition cannot be formed into a film, the glass transition temperature in the present invention can be obtained from a temperature of a flexion point on baseline of a differential scanning calorimetry (DSC).

From the viewpoint of dimensional stability, the linear thermal expansion coefficient of the polyimide obtained from the resin composition of the present invention is preferably 60 ppm or less, more preferably from 0 ppm to 40 ppm. In the case of forming a film on a silicon wafer in a production process of semiconductor elements, the linear thermal expansion coefficient is preferably from 0 ppm to 25 ppm from the viewpoint of adhesion property and warp of a substrate. Herein, the linear thermal expansion coefficient in the present invention can be determined by analyzing a film of the polyimide obtained from the resin composition of the present invention by means of a thermomechanical analyzer (TMA). The linear thermal expansion coefficient is a value measured by means of the thermomechanical analyzer (for example, product name: Thermo Plus TMA8310, manufactured by Rigaku Corporation) under the condition including a heating rate of 10° C./min and a tensile load of 1 g/25,000 μm² so that each load per area of cross section of an evaluating sample is equal.

Similarly, from the viewpoint of dimensional stability, the humidity expansion coefficient of the polyimide obtained from the resin composition of the present invention is preferably 40 ppm or less, more preferably 20 ppm or less. Ideally, 10 ppm to 0 ppm is preferred.

Herein, the humidity expansion coefficient in the present invention can be determined by analyzing a film of the polyimide obtained from the resin composition of the present invention by means of a humidity variable mechanical analyzer (S-TMA). A difference between sample lengths of a sample being stable in an environment with a temperature of 25° C. and a relative humidity of 20% and the sample the relative humidity being changed to 50% and being stable using the humidity variable mechanical analyzer (for example, product name: modified Thermo Plus TMA8310, manufactured by Rigaku Corporation), is divided by difference in humidity (in this case 50 minus 20 is 30). Then, the value obtained thereby is divided by the sample length at 20% RH. Thereby, the humidity expansion coefficient can be obtained. A tensile load is 1 g/25,000 μm² so that each load per area of cross section of an evaluating sample is equal.

III. Pattern Forming Method

The pattern forming method of the present invention comprises an exposure step of irradiating a surface of a film or molded body of the photosensitive resin composition according to the present invention with electromagnetic waves in a predetermined pattern, and a developing step of developing either an exposed or unexposed portion with a solvent which is capable of dissolving the exposed or unexposed portion as a developer.

In the photosensitive resin composition containing the polyimide precursor and the photoacid or photobase generator, the hemiacetal ester bond of the polyimide precursor is decomposed by the action of acid or base generated from the photoacid generator or photobase generator due to the action of light. Thereby, the solubility of the photosensitive resin composition in an aqueous solution or an organic solvent changes. By utilizing this change in solubility, when exposure is performed in a desired pattern and a soluble portion is dissolved with a good solvent, a pattern can be obtained.

Particularly, in the case of the photosensitive resin composition containing the polyimide precursor and the compound which generates a carboxylic acid by the action of light, the pattern forming method of the present invention includes a heating step of heating a film or molded body made of the photosensitive resin composition containing the polyimide precursor and the compound which generates a carboxylic acid by the action of light upon or after forming the film or molded body; an exposure step of irradiating the surface of the film or molded body after the heating step with electromagnetic waves in a predetermined pattern; and a developing step of developing the film or molded body with a basic solution as a developer.

The film or molded body made of the photosensitive resin composition of the present invention can be produced by any of known methods. For example, the film can be obtained by coating the photosensitive resin composition of the present invention on a substrate and drying the composition. Herein, the substrate is an object on which a polyimide film is to be formed. Examples of the substrate are inorganic materials including metals such as copper and stainless, silicon, metal oxides, metallic nitrides, and organic materials such as polyimides and polybenzoxazole. Though adhesion and soon slightly vary from substrate to substrate, pattern forming and properties of film to be obtained are not substantially different. Hence, in the present invention, the substrate is not particularly limited.

Examples of the coating method include a spin coating method, a die coating method and a dip coating method, but are not particularly limited thereto. Any of known methods can be used. The pattern forming method of the present invention can also be used for a film obtained by any of the coating methods.

Drying can be performed accordingly by any of known heating methods such as using a hot plate or oven.

In the exposure step, the thus obtained film or molded body is irradiated with electromagnetic waves through a photomask with a desired pattern or directly in a pattern shape.

A light source of the exposure is not particularly limited and any known light source may be used. Especially in the case of an aromatic polyimide having high heat resistance and low linear thermal expansion coefficient, because the polyimide precursor has a strong absorption in the wavelength of 350 nm or less, it is preferred to expose the polyimide precursor to light at the wavelength of 360 nm or more when used as a highly photosensitive resin composition. From the viewpoint of the above conditions, availability, cost for maintenance and so on, a light source such as a high-pressure mercury-vapor lamp or the like is preferably used.

The exposure method and exposure equipment used in the exposure step is not particularly limited. Contact exposure or indirect exposure may be performed. Any of known means such as a stepper, a scanner, an aligner, a contact printer, a laser and electron beam lithography may be used.

Heating is performed after the exposure step and before the developing step, if necessary.

By heating appropriately, in the exposed portion of the film or molded body, the decomposition of the hemiacetal ester bond by base generated by the exposure is accelerated and changes into a carboxyl group or the like.

The heating temperature is preferably from room temperature (23° C.) to 180° C. The temperature depends on the structure of $R^1$ in the formula (1) and $R^8$ in the formula (2) of the polyimide precursor. Generally, if the electron attractivity of $R^1$ is strong or the electron donatability of $R^8$ is strong, the hemiacetal ester bond often decomposes at lower temperature. In the reverse case, heating at higher temperature is often required. If the heating temperature is too high, the hemiacetal bond of the unexposed portion also decomposes. Hence, a temperature at which a degree of decomposition of the hemiacetal bond in the exposed portion and a degree of decomposition of the hemiacetal bond in the unexposed portion are largely different is appropriately selected.

The heating temperature is appropriately selected depending on the structure of the polyimide precursor. The heating time may be 5 seconds to 120 minutes, preferably 30 seconds to 30 minutes, from the viewpoint of productivity. A heating method may be any of known methods.

After the hemiacetal ester bond in the exposed portion is decomposed, the developing step is performed.

The photosensitive resin composition of the present invention can change the solubility of the exposed portion and unexposed portion in various solvent by the action of acid or base breaking the hemiacetal ester bond.

The unexposed portion of the photosensitive resin composition of the present invention is hardly soluble in basic aqueous solutions, and soluble in organic (polar) solvents including amide-based solvents. On the other hand, in the exposed portion, the hemiacetal ester bond of the polyimide precursor breaks by hydrolysis due to the action of the generated acid or base to give a polyamic acid. Also, under the condition that the amount of moisture is extremely low in the presence of base with heating if necessary, the polyimide precursor is imidized, and accordingly, the hemiacetal ester bond is decomposed into an alcohol and acetaldehyde. Thus, if the amount of moisture in the film is large or the humidity of environment is high, the hemiacetal ester bond decomposes to give an amic acid. However, in the case that the solvent is dehydrated and the environment is controlled to have no moisture substantially, the polyimide precursor is imidized.

The polyamic acid is soluble mainly in amide-based organic solvents, dimethyl sulfoxide and basic aqueous solutions, and is insoluble in non-amide-based organic solvents except some solvents such as dimethyl sulfoxide. To the contrary, generally, polyimides, particularly aromatic polyimides, are hardly soluble in any solvents. Hence, the solubility of the exposed or unexposed portion can be controlled by the conditions of processes such as exposure and heating after exposure, if necessary.

When the hemiacetal ester bond decomposes to give the polyamic acid, a positive type pattern can be obtained by development with a basic aqueous solution, and a negative type pattern can be obtained by development with a non-amide-based organic solvent such as γ-butyrolactone. When the hemiacetal ester bond is imidized, a negative type pattern can be obtained by development with a non-amide-based organic solvent such as γ-butyrolactone.

In this way, the photosensitive resin composition of the present invention can be used as a positive type or a negative type depending on developers and processes.

The positive type has an advantage that more inexpensive basic aqueous solution can be used. The negative type has an advantage that hemiacetal esterified portions in a pattern portion decomposes and decomposed products volatile, thus, protective group-derived residual components do not remain in a polyimide film.

Besides the above, it is possible to use a method including introducing an epoxy group, an oxetanyl group or the like, which causes a cross-linking reaction by base, into the polyimide precursor, subjecting the exposed portion to insolubilization, and thus obtaining a negative type pattern. In the case of using such a negative type photosensitive polyimide, in which a pattern is obtained by the mechanism that the solubility is reduced by intermolecular cross-linking, generally, crosslinked portions are less likely to thermally decompose and volatilize. Thus, decomposition residues of photosensitivity-imparting components are likely to remain in the film after imidization. Further, since development is often performed by organic solvents, applications to be used are limited.

The developer used in the developing step is not particularly limited. A basic aqueous solution, an organic solvent, an acid aqueous solution, a neutral aqueous solution, and so on can be selected according to the polyimide precursor to be used.

The basic aqueous solution is not particularly limited. Examples of the basic aqueous solutions are a tetramethylammonium hydroxide (TMAH) aqueous solution, a potassium hydroxide aqueous solution, a sodium hydroxide aqueous solution, a magnesium hydroxide aqueous solution, a calcium hydroxide aqueous solution, a sodium hydrogencarbonate aqueous solution, an aqueous solution of primary, secondary or tertiary amine, and an aqueous solution of salt of hydroxide ion and ammonium ion, having a concentration of 0.01 wt % to 30 wt %, preferably 0.05 wt % to 10 wt %.

A solute may be one kind only, or two or more kinds. An organic solvent or the like may be contained if water is included by 50% or more, preferably 70% or more, of the total weight.

The organic solvent is not particularly limited. Examples of the organic solvents include ethers such as diethyl ether, tetrahydrofuran, dioxane, ethylene glycol dimethyl ether, ethylene glycol diethyl ether, propylene glycol dimethyl ether, and propylene glycol diethyl ether; glycol monoethers (so-called cellosolves) such as ethylene glycol monomethyl ether, ethylene glycol monoethyl ether, propylene glycol monomethyl ether, propylene glycol monoethyl ether, diethylene glycol monomethyl ether, and diethylene glycol monoethyl ether; ketones such as methyl ethyl ketone, acetone, methyl isobutyl ketone, cyclopentanone, and cyclohexanone; esters including ethyl acetate, butyl acetate, n-propyl acetate, i-propyl acetate, n-butyl acetate, i-butyl acetate, acetic acid esters of the glycol monoethers such as methylcellosolve acetate and ethylcellosolve acetate, methoxypropyl acetate, ethoxypropyl acetate, dimethyl oxalate, methyl lactate, and ethyl lactate; alcohols such as methanol, ethanol, isopropanol, propanol, butanol, hexanol, cyclohexanol, ethylene glycol, diethylene glycol, and glycerin; halogenated hydrocarbons such as methylene chloride, 1,1-dichloroethane, 1,2-dichloroethylene, 1-chloropropene, 1-chlorobutane, 1-chloropentane, chlorobenzene, bromobenzene, o-dichlorobenzene, and m-dichlorobenzene; amides such as N,N-dimethylformamide, and N,N-dimethylacetamide; pyrrolidones such as N-methylpyrrolidone; lactones such as γ-butyrolactone; sulfoxides such as dimethyl sulfoxide; saturated hydrocarbons such as hexane, cyclohexane, and heptane; and other organic polar solvents. Further, examples include aromatic hydrocarbons such as benzene, toluene, and xylene, and other organic nonpolar solvents. The solvent can be used alone or in combination of two or more kinds. Also, in order to obtain an excellent pattern shape, the organic solvent and water, or the basic or acid aqueous solution can be used in combination as a mixed solvent.

From the viewpoint of the cost of the developer itself and production equipments, and waste liquid treatment, development with the basic aqueous solution is preferable. Particularly, if high reliability is required for the polyimide film to be finally obtained, organic base is more preferably used than a hydroxide of an alkali metal or an alkaline earth metal. Particularly, from the viewpoint of being easily available and cost, tetramethylammonium hydroxide (TMAH) is preferable.

The development can be performed by any of known development methods such as spray development, dipping development and puddle development. The temperature upon development is preferably 1° C. to 80° C., more preferably 4° C. to 60° C.

If necessary, rinse treatment may be performed after the development. A rinse may be appropriately selected from water, a mixture of water and the organic solvent and the basic aqueous solution.

In the case of the positive type required to decrease the amount of residues in the film, and being hard to completely eliminate the protective groups in the heating step for imidization hereinafter mentioned, though number of steps increases, a method including the following steps may also be employed after development and pattern formation: exposing the whole film or molded body followed by heating, if necessary, to eliminate the protective groups, and then, performing imidization hereinafter described.

After the developing step, imidization is performed. Generally, the imidization is often performed by heating in an oven or a hot plate.

Generally, it is said that imidization of polyamic acids gradually starts from about 150° C., and mostly completes at around 200° C. or more. However, if higher reliability is required, it is necessary to proceed closer to a complete imidization. In this case, heating at a temperature of Tg of the polyimide film to be finally obtained or higher is ideally performed. However, generally, a polyimide film having reliability sufficient for practical use can be obtained by heating at 300° C. to 400° C.

In the case of the resin composition of the present invention, it is possible to accelerate the elimination of protective group-derived residual components closer to a complete elimination by extending the heating time at 180° C. or less since the hemiacetal ester bond decomposes completely at around 180° C. Longer heating time is preferable from the viewpoint of decreasing the amount of residual components in the polyimide. Heating for 1 minute to 180 minutes, more preferably 5 minutes to 120 minutes, in total at 40° C. or more and 180° C. or less is preferable in order to balance the decrease of the amount of residual components and productivity.

Further, in accordance with the intended use, heating at 180° C. to 450° C., preferably 200° C. to 400° C., may be performed, in order to complete imidization. Preferably, the highest heating temperature is 251° C. or more and 400° C. or less.

Particularly, when heating is performed at 100° C. or more, it is preferred to perform under inert atmosphere such as nitrogen or argon in order to prevent oxidation of the polyimide and a substrate. Further, in order to decrease the amount of residual components in the polyimide, it is preferred to perform under reduced pressure.

Particularly, heating conditions in the heating step in which the film or molded body made of the photosensitive resin composition is heated upon being formed or after being formed and before exposure, used for the photosensitive resin composition containing the above-mentioned polyimide precursor and the compound which generates a carboxylic acid by the action of light, may be determined, for example, by performing a preliminary experiment as follows.

Firstly, for example, the relationship between the heating conditions and the rate of decomposition of hemiacetal ester bonds is obtained by: heating a 1 wt % deuterated DMSO solution of the polyimide precursor in a NMR tube, and determining the relationship from the integrated ratio of peaks of NMR spectrum; applying the solution of the polyimide precursor on a substrate such as alkali-free glass having a thickness of 800 λm, heating on a hot plate, preparing samples different in temperature and heating time, measuring the samples by IR, and determining the relationship from the integrated ratio of peaks derived from vinyl ethers by IR spectrum; or dissolving the samples in deuterated DMSO, measuring the samples by NMR, and determining the relationship from the integrated ratio of spectrum.

From the relationship between the heating conditions and the rate of decomposition of hemiacetal ester bonds obtained as above, the range of heating conditions is appropriately narrowed down. The dissolution rate of a sample prepared in the same condition as the heating conditions of narrowed-down range with respect to a developer is obtained. Then, the heating conditions (heating temperature, heating time and so on) can be determined in such a way that the rate of decomposition is within the range in which the dissolution rate of a film made of the polyimide precursor being used alone is from 0.1 nm/s to 100 nm/s, preferably from 0.5 nm/s to 50 nm/s, more preferably from 1 nm/s to 20 nm/s, with respect to a developer.

Alternatively, there is a way not obtaining the rate of decomposition of hemiacetal ester bonds. Specifically, a plurality of samples different in heating temperature and heating time of a film made of the polyimide precursor being used alone are formed. Then, the heating conditions may be determined from a sample which has a dissolution rate of 0.1 nm/s to 100 nm/s, preferably 0.5 nm/s to 50 nm/s, more preferably 1 nm/s to 20 nm/s, with respect to a developer.

Also, particularly, in the case of the photosensitive resin composition containing the compound which generates a carboxylic acid by the action of light, and when required to decrease the amount of residues in the film or to improve transparency of the film, though number of steps increases, a method including the following steps may also be employed after development and pattern formation: exposing the whole film or molded body to generate carboxylic acids, and then, performing imidization. Particularly, if the compound which generates a carboxylic acid by the action of light is a compound having an o-quinone diazide group, the effect is high since changing into a carboxylic acid by exposure to photobleach improves transparency.

The photosensitive resin composition according to the present invention is capable of pattern forming in such a manner that the surface of the film or molded body made of the composition is irradiate with electromagnetic waves to selectively make an irradiated site easily or hardly soluble. Thus, it is possible to attain pattern forming by development without using a resist film for protecting the surface of the film or molded body made of the photosensitive resin composition from a developer. The merit of this method is that processes of pattern forming are simple. Particularly, the use of the basic aqueous solution is small in environmental burden and adverse affect on industrial health.

IV. Article

The photosensitive resin composition of the present invention may be used in all known fields and products using resin materials such as printing inks, adhesives, electronic materials, optical circuit parts, molding materials, resist materials, building materials, three-dimensional articles, and optical members. Since the photosensitive resin composition of the present invention can select polyimide precursors of a wide range of structures so that functions being characteristics of polyimides such as heat resistance, dimensional stability, and insulation can be imparted to the cured product made of the resin composition, the resin composition is suitable for all known films for members, coated films or three-dimensional structures in which polyimides are used. Particularly, the photosensitive resin composition containing the polyimide precursor is mainly used as pattern-forming materials (resist). A pattern formed therewith functions as a permanent film made of the polyimide and as a component imparting heat resistance and insulation.

The photosensitive resin composition of the present invention may be suitably used as a paint, a printing ink, an sealant, an adhesive, or a formation material of displays, semiconductor devices, electronic parts, micro electro mechanical systems (MEMS), optical members or building materials. Specifically, as for examples of the formation materials of displays, the resin composition of the present invention can be used as a layer formation material and an image formation material for color filters, flexible display films, resist materials, and orientation layers. Also, as for examples of the formation materials of semiconductor devices, the resin composition of the present invention can be used as a resist material, and a layer formation material used for buffer coating layers. Also, as for examples of the formation materials of electronic parts, the resin composition of the present invention can be used as an encapsulant and a layer formation material for printed circuit boards, layer insulation films, and wire cover films. Also, as for examples of the formation materials for optical members, the resin composition of the present invention can be used as an optical material and a layer formation material for holograms, optical waveguides, optical circuits, optical circuit parts, and antireflection films. Also, as for examples of the building materials, the resin composition of the present invention can be used as a paint, and a coating agent. Also, the resin composition of the present invention may be used as a material for optical three-dimensional objects.

According to the present invention, an article selected from printed products, displays, semiconductor devices, electronic parts, optical members and building materials, at least a part of which is formed with the photosensitive resin composition of the present invention or a cured product thereof, is provided.

EXAMPLES

Production Example 1

After a 100 ml three-neck flask was heated under nitrogen flow to be dried sufficiently, 0.99 g of a white solid substance of BPDA-ODA (a polyamic acid made of 3,3',4,4'-biphenyltetracarboxylic dianhydride and 4,4'-diaminodiphenyl ether; number average molecular weight obtained from NMR of 12,000), which was obtained by polymerizing with a dimethylacetamide solvent followed by refining by reprecipitation with acetone and drying a precipitate obtained, 5 g of n-butyl vinyl ether (n-BVE), and 5 ml of dried γ-butyrolactone were charged in the flask with careful attention to moisture in the air. Stirring was performed with a magnetic stirrer for 112 hours under dried nitrogen flow at room temperature. BPDA-ODA did not dissolve in the beginning but dissolved with progression of the reaction, and became a brown liquid. Then, a half amount of the reaction liquid was reprecipitated with dried diethyl ether. Thus, a white solid substance of BPDA-ODA protected by n-butyl vinyl ether (polyimide precursor 1) represented by the following formula was quantitatively obtained. Through analysis of ¹H-NMR, it was confirmed that the protection rate (the reactivity of hemiacetal ester bonds to carboxyl groups) was 100% determined from a ratio of an integral value of peaks of hydrogens bonded to the carbon between oxygens of hemiacetal ester bonds around 6.2 ppm to an integral value of peaks of hydrogens of aromatic rings of diphenyl ether.

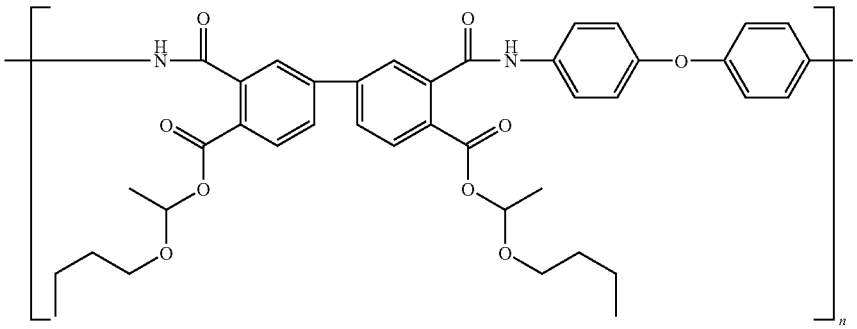

Production Examples 2 to 5

Synthesis was performed in the similar conditions as Production example 1 except that n-butyl vinyl ether was changed to different vinyl ether compounds shown in Table 1. In all experiments, white solid substances of polyimide precursors 2 to 5 having a protection rate of 100% was obtained quantitatively without gelation. As for polyimide precursor 5, the ratio of protective groups of n-BVE and VEEA (n-BVE: VEEA) was 65:35 from the integrated ratio obtained by 1H-NMR.

TABLE 1

|  |  | Vinyl ether compound |  | Reaction time |
| --- | --- | --- | --- | --- |
| Production example 2 | Polyimide precursor 2 | Cyclohexyl vinyl ether | CVE | 88 hrs |
| Production example 3 | Polyimide precursor 3 | t-Butyl vinyl ether | t-BVE | 48 hrs |
| Production example 4 | Polyimide precursor 4 | Ethylene glycol butyl vinyl ether | EGBVE | 112 hrs |
| Production example 5 | Polyimide precursor 5 | A mixed compound of n-butyl vinyl ether and VEEA by molar ratio of 65:35 | n-BVE:VEEA = 65:35 | 112 hrs |

VEEA:

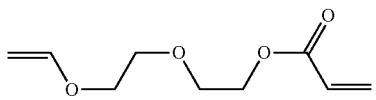

Production Example 6

Synthesis was performed in the similar conditions as Production example 1 except that 3,4-dihydro-2H-pyrane (DHP) was used instead of n-butyl vinyl ether, and the reaction time was 240 hours. In the experiment, gelation did not occur, and a white solid substance of polyimide precursor 6 was obtained. Similarly as Production example 1, through analysis of ¹H-NMR, it was confirmed that the protection rate (the reactivity of hemiacetal ester bonds to carboxyl groups) of Production example 6 was 100%.

Production Example 7

Synthesis was performed in the similar conditions as Production example 1 except that 2-vinyloxy tetrahydropyrane (THPVE, a primary vinyl ether compound) was used instead of n-butyl vinyl ether, and the reaction time was 112 hours. In the experiment, gelation did not occur, and a white solid substance of polyimide precursor 7 was obtained. Similarly as Production example 1, through analysis of ¹H-NMR, it was confirmed that the protection rate (the reactivity of hemiacetal ester bonds to carboxyl groups) of Production example 7 was 100%.

Production Example 8

After a 100 ml three-neck flask was heated under nitrogen flow to be dried sufficiently, 1.98 g of a white solid substance of BPDA-ODA (a polyamic acid made of 3,3',4,4'-biphenyltetracarboxylic dianhydride and 4,4'-diaminodiphenyl ether), which was obtained by polymerizing with a dimethylacetamide solvent followed by refining by reprecipitation with acetone and drying, 5 g of 2-vinyloxy tetrahydropyrane (THPVE), and 10 ml of dried γ-butyrolactone were charged in the flask with careful attention to moisture in the air. Stirring was performed with a magnetic stirrer for 44 hours under dried nitrogen flow at room temperature. BPDA-ODA did not dissolve in the beginning but dissolved with progression of the reaction, and became a brown liquid. Then, a part of the reaction liquid was reprecipitated with dried diethyl ether. Thus, a white solid substance of BPDA-ODA partially protected by vinyl ether was obtained. Through analysis of ¹H-NMR, it was confirmed that the protection rate (the reactivity of hemiacetal ester bonds to carboxyl groups) was 55% determined from a ratio of an integral value of peaks of hydrogens bonded to the carbon between oxygens of hemiacetal ester bonds around 6.2 ppm to an integral value of peaks of hydrogens of aromatic rings of diphenyl ether. Furthermore, 5 g of cyclohexyl vinyl ether was added to the reaction liquid, and stirred at room temperature for 24 hours. A part of the reaction liquid was reprecipitated with dried diethyl ether. Thus, a white solid substance of polyimide precursor 8 was obtained. In the similar procedures as Production example 1, a protection rate and a molecular weight were measured. The protection rate was 100% (CVE/THPVE=35 mol %/65 mol %). The weight average molecular weight in terms of the polystyrene calibrated standard measured by GPC was 18,600. The reaction time was 68 hours.

Production Example 9

After a 100 ml three-neck flask was heated under nitrogen flow to be dried sufficiently, 1.98 g of a white solid substance of BPDA-ODA (a polyamic acid made of 3,3',4,4'-biphenyltetracarboxylic dianhydride and 4,4'-diaminodiphenyl ether), which was obtained by polymerizing with a dimethylacetamide solvent followed by refining by reprecipitation with acetone and drying, 5 g of 2-vinyloxytetrahydropyrane (THPVE), 5 g of cyclohexyl vinyl ether (CVE), and 10 ml of dried γ-butyrolactone were charged in the flask with careful attention to moisture in the air. Stirring was performed with a magnetic stirrer for 44 hours under dried nitrogen flow at room temperature (25° C.). BPDA-ODA did not dissolve in the beginning, but dissolved with progression of the reaction, and became a brown liquid. Then, apart of the reaction liquid was reprecipitated with dried diethyl ether. Thus, a white solid substance of BPDA-ODA protected by vinyl ether (polyimide precursor 9) was obtained. Through analysis of $^1$H-NMR, it was confirmed that the protection rate (the reactivity of hemiacetal ester bonds to carboxyl groups) was 100% determined from a ratio of an integral value of peaks of hydrogens bonded to the carbon between oxygens of hemiacetal ester bonds around 6.2 ppm to an integral value of peaks of hydrogens of aromatic rings of diphenyl ether. The ratio of protected substituents (CVE/THPVE) was 77 mol %/23 mol %. The weight average molecular weight in terms of the polystyrene calibrated standard measured by GPC was 18,200.

Production Examples 10 to 11

Similarly as Production example 9 except that tert-butyl vinyl ether (t-BVE) was used instead of CVE, polyimide precursor 10 (t-BVE/THPVE=93 mol %/7 mol %) was obtained. The reaction time was 40 hours, and the weight average molecular weight was 17,900.

Also, similarly as Production example 9 except that 3,4-dihydro-2H-pyrane (DHP, a primary vinyl ether compound) was used instead of THPVE, polyimide precursor 11 (CVE/DHP=85 mol %/15 mol %) was obtained. The reaction time was 70 hours, and the weight average molecular weight was 18,100.

Production Example 12

In the similar conditions as Production example 4 except that the polyamic acid was changed to BPDA-4PPD-1ODA (a polyamic acid synthesized using dianhydride (3,3',4,4'-biphenyltetracarboxylic dianhydride) and diamine (a mixture of paraphenylene diamine and 4,4'-diaminodiphenyl ether by molar ratio of 4:1); number average molecular weight by NMR of 14,000), polyimide precursor 12 was synthesized.

Production Example 13

After a 200 ml three-neck flask was heated under nitrogen flow to be dried sufficiently and cooled to room temperature (25° C.), 5.88 g (20 mmol) of 3,3',4,4'-3,3',4,4'-biphenyltetracarboxylic dianhydride (BPDA), 30 g of cyclohexyl vinyl ether (CVE), and 25 g of preliminarily dehydrated γ-butyrolactone were charged in the flask with careful attention to moisture in the air. Stirring was performed under nitrogen flow at room temperature.

Therein, a liquid having 4.0 g (20 mmol) of 4,4'-diaminodiphenyl ether (ODA) dissolved in 20 g of preliminarily dehydrated γ-butyrolactone was dropped gradually for 30 minutes. After completion of dropping, a precipitate deposited. However, after the following stirring at room temperature, the precipitate was totally dissolved. Continuously, stirring was performed for 168 hours to complete the reaction.

A part of the liquid was refined by reprecipitation with dehydrated diethyl ether. Thus, a white solid substance was obtained. A deuterated dimethyl sulfoxide solution of the white solid substance was analyzed by $^1$H-NMR. It was confirmed that the white solid substance was BPDA-ODA (a polyamic acid made of 3,3',4,4'-biphenyltetracarboxylic dianhydride and 4,4'-diaminodiphenyl ether) in which all carboxyl groups were protected by CVE. Through analysis of $^1$H-NMR, it was confirmed that the protection rate (the reactivity of hemiacetal ester bonds to carboxyl groups) was 100% determined from a ratio of an integral value of peaks of hydrogens bonded to the carbon between oxygens of hemiacetal ester bonds around 6.2 ppm to an integral value of peaks of hydrogens of aromatic rings of diphenyl ether. The number average molecular weight, determined from a ratio of an integral value of peaks derived from end groups to an integral value of peaks of diphenyl ether parts in repeating units in $^1$H-NMR spectrum, was 9,200 (polyimide precursor 13).

Production Example 14

Synthesis was performed in the similar conditions as Production example 13 except that cyclohexyl vinyl ether was changed to ethylene glycol butyl vinyl ether. Gelation did not occur. Thus, a white solid substance of polyimide precursor 14 was obtained. The reaction time was 220 hours, and the number average molecular weight was 10,300.

Production Example 15

Synthesis was performed in the similar conditions as Production example 13 except that cyclohexyl vinyl ether was changed to t-butyl vinyl ether. Gelation did not occur. Thus, a white solid substance of polyimide precursor 15 was obtained. The reaction time was 150 hours, and the number average molecular weight was 7,100.

Production Example 16

Synthesis was performed in the similar conditions as Production example 1 except that n-butyl vinyl ether was changed to isopropyl vinyl ether. Gelation did not occur. Thus, a white solid substance of polyimide precursor 16 was obtained. The reaction time was 88 hours. Similarly as Production example 1, through analysis of $^1$H-NMR, it was confirmed that the protection rate (the reactivity of hemiacetal ester bonds to carboxyl groups) was 100%.

Production Example 17

Synthesis was performed in the similar conditions as Production example 1 except that n-butyl vinyl ether was changed to sec-butyl vinyl ether. Gelation did not occur. Thus, a white solid substance of polyimide precursor 17 was obtained. The reaction time was 88 hours. Similarly as Production example 1, through analysis of $^1$H-NMR, it was confirmed that the protection rate (the reactivity of hemiacetal ester bonds to carboxyl groups) was 100%.

The half of reaction liquids of Production examples 1 to 17 remained were referred to as polyimide precursor resin compositions 1 to 17 containing a polyimide precursor and a vinyl ether compound. No change such as gelation and production of precipitate was observed in the polyimide precursor resin compositions 1 to 17 after storage at room temperature for 300 hours.

Comparative Production Example 1

Reaction was performed in the similar conditions as Production example 1 except that vinyl ether being used was change to 5 g of VEEA (manufactured by Nippon Shokubai Co., Ltd.). As a result, the reaction liquid gelated after 200 hours.

Comparative Production Example 2

Reaction was performed in the similar conditions as Production example 1 except that vinyl ether being used was changed to 5 g of a mixture of VEEA (manufactured by Nippon Shokubai Co., Ltd.) and n-butyl vinyl ether by mole equivalent of 1:1. As a result, the reaction liquid gelated after 290 hours.

Reference Examples 1 to 6

Synthesis of Model Compounds

In the similar method as Production example 1, model compounds 1 to 6 of the following structures were synthesized. In all experiments, gelation did not occur, and the protection rate of carboxyl groups was 100%.

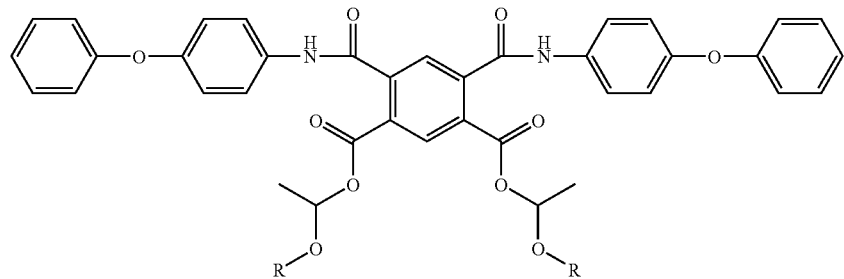

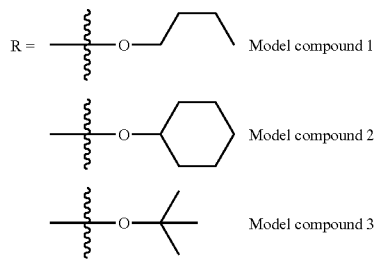

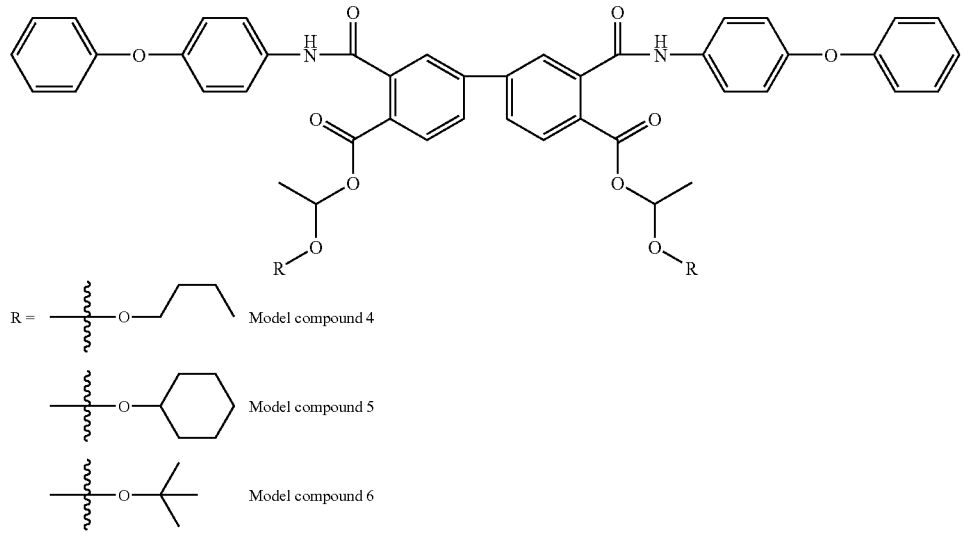

<Storage Stability Evaluation of Polyimide Precursor>

As for a 2 wt % deuterated dimethyl sulfoxide solution (not dehydrated) of model compounds 1 to 6 obtained in the above production examples, the rate of decomposition of hemiacetal ester bonds after storage at room temperature for 24 hours was measured. Similarly as Production example 1, a protection rate was measured by 1H-NMR, and the rate of decomposition was determined from the following formula:

Rate of decomposition (%)=(1−protection rate after storage/protection rate just after preparation)×100

TABLE 2

Relationship between the structure of hemiacetal ester bond and the rate of decomposition after 24 hours

| Dianhydride | Rate of decomposition of hemiacetal ester bonds (%) Vinyl ether | | |
|---|---|---|---|
| | n-BVE | CVE | t-BVE |
| | Model compound 1 | Model compound 2 | Model compound 3 |
| PMDA | 100 | 100 | 100 |
| | Model compound 4 | Model compound 5 | Model compound 6 |
| BPDA | 56 | 80 | 100 |

PMDA: pyromellitic dianhydride
BPDA: 3,3',4,4'-biphenyltetracarboxylic dianhydride Both PMDA and BPDA are representative dianhydrides used for polyimides having a low linear thermal expansion coefficient. The above results show that, as for dianhydrides, hemiacetal ester bonds having higher stability can be formed by BPDA than PMDA. Further, vinyl ether compounds used for protection were highly stable in the order of tertiary carbon<secondary carbon<primary carbon (vinyl ether compounds having lower rate of decomposition were more stable).

The above results show that PMDA series in the liquid was almost completely decomposed after 24 hours.

Similarly, as for a 2 wt % deuterated dimethyl sulfoxide solution (not dehydrated) of polyimide precursors 1 to 4 obtained in the above production examples, both rates of decomposition of hemiacetal ester bonds after storage at room temperature for 24 hours and 120 hours were measured. Similarly as Production example 1, the rate of decomposition was determined by 1H-NMR from the integrated ratio of peaks.

TABLE 3

The structure of polyimide precursors and the rate of decomposition (%) after 24 hours and 120 hours

| | Vinyl ether | 24 hrs | 120 hrs |
|---|---|---|---|
| Polyimide precursor 1 | n-BVE | 5 | 60 |
| Polyimide precursor 2 | CVE | 68 | 100 |
| Polyimide precursor 3 | t-BVE | 100 | 100 |
| Polyimide precursor 4 | EGBVE | 0 | 30 |

The influence of the structure of protective groups on storage stability in the polyimide precursors showed similar tendency as that in the experiments of model compounds. Particularly, polyimide precursor 4, which has protective groups having an ether bond by a primary vinyl ether compound, exhibited excellent storage stability.

Also, it was confirmed that in comparison with model compounds, polyimide precursors having higher molecular weight have higher decomposition stability.

<Thermal Decomposability Evaluation 1>

Using a 2 wt % deuterated dimethyl sulfoxide solution (not dehydrated) of polyimide precursors 1 to 4, 6, 7, 8 and 13, protection rates upon being heated were measured. After heating at each temperature for 5 minutes in an NMR tube, similarly as Production example 1, the protection rate was determined by 1H-NMR from an integrated ratio of peaks. The relationship between heating temperatures and protection rates of polyimide precursor 2 and polyimide precursor 13, both using cyclohexyl vinyl ether as a protective group, were the same. A graph representing the relationship between the heating temperatures and the protection rates of each polyimide precursor (polyimide precursors 1 to 4, 6, 7 and 8) is shown in FIG. 1.

As shown in FIG. 1, thermal decomposability showed similar tendency as the above-described storage stability. This results show that all hemiacetal ester bonds were broken in the liquid upon heating at about 120° C. The protection rate of polyimide precursor 3 just after preparation was 100%. However, protective groups decomposed while preparing measurement of the protection rate, and the protection rate was not 100% at room temperature upon starting the measurement.

<Stability Evaluation of Film Upon Heating>

Next, stability of actual film upon heating was confirmed using an infrared spectrometer.

Reaction liquid 2 and reaction liquid 4 respectively upon synthesis of polyimide precursor 2 and polyimide precursor 4 were used as samples. Film having a thickness of 1 μm±0.1 μm were formed on a chrome-plated glass by coating. While raising the temperature from room temperature to 150° C. at a rate of 5° C. per 1 minute on a hot plate, IR spectra were measured in real time.

Figure 2:
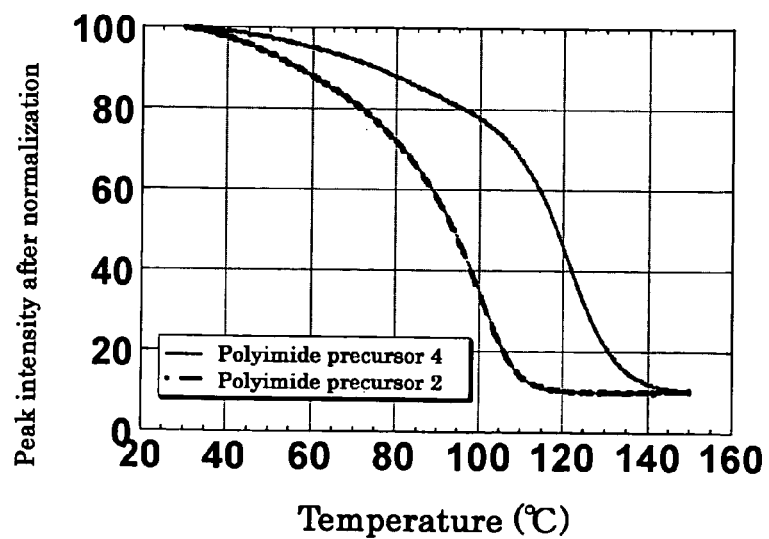
FIG. 2 is a graph plotting a peak intensity of 1,120 cm$^{-1}$ derived from an acetal part against temperature.

Among the obtained spectra, peaks of 1,120 cm$^{-1}$ derived from acetal parts were normalized for initial peak intensity as 100, peak intensities were plotted with respect to temperatures. The plotted figure is shown in FIG. 2.

The peak intensities of both samples did not change at normalized intensity of around 10 in a high-temperature region. It seems that there was a baseline of spectrum in this portion, or a tail of an adjacent peak overlapped this portion. Therefore, it can be assumed that protective groups were almost completely broken at around 110° C. in polyimide precursor 2, and at around 150° C. in polyimide precursor 4.

Also, it can be considered that the normalized peak intensity gradually decreased with continuous heating since the normalized peak overlapped the peak of the vinyl ether compound remained in the film, and thereby, the intensity decreased with volatilization of the vinyl ether compound from the film.

In comparison with the thermal decomposability evaluation of the liquid, in the evaluation of film, the decomposition temperature increased by about 30 to 40° C.

From these results, it was confirmed that polyimide precursor 4 particularly exhibits high stability with respect to heat in the processes of drying the film and so on.

As for condition when forming the film, while polyimide precursor 2 slightly tended to be repellent to the substrate and had not so high adhesion to the substrate, polyimide precursor 4 was able provide a film having a uniform thickness and had high adhesion to the substrate. It can be assumed that these results depend on the chemical structure of a protective group. While the protective group of polyimide precursor 2 is a cyclohexyl group which has a bulky and high hydrophobic structure, the protective group of polyimide precursor 4 is a butoxyethyl group which has a flexible and hydrophilic structure. It can be considered that this point has influence on adhesion and film forming property.

<Thermogravimetric Decrease Evaluation>

The thermogravimetric loss of polyimide precursor 4 was measured by raising temperature by 10° C./min and providing nitrogen by 50 mL/min.

As a result, loss in weight at 300° C. was 41.9%, which is close to a theoretical value (41.5%) of loss in weight when elimination of protective groups and imidization completely proceed. It was confirmed that the elimination reaction of protective groups and imidization were almost completely proceeded. This suggests that decomposed products do not remain in the polyimide film, and there is no outgassing or decline in reliability when the polyimide precursor of the present invention is used.

<Infrared-Spectroscopic Evaluation>

Samples of polyimide precursor 4 and BPDA-ODA were respectively subjected to heat treatment under nitrogen atmosphere at 350° C. for one hour (heating rate of 10° C./min from room temperature). Then, the infrared spectrum of each sample was measured. Though the baseline did not slightly overlap, all main peaks were in the same wavenumber and both spectra were almost the same. This showed that almost no impurity is remained in the polyimide precursor of the present invention after imidization.

Figure 3:
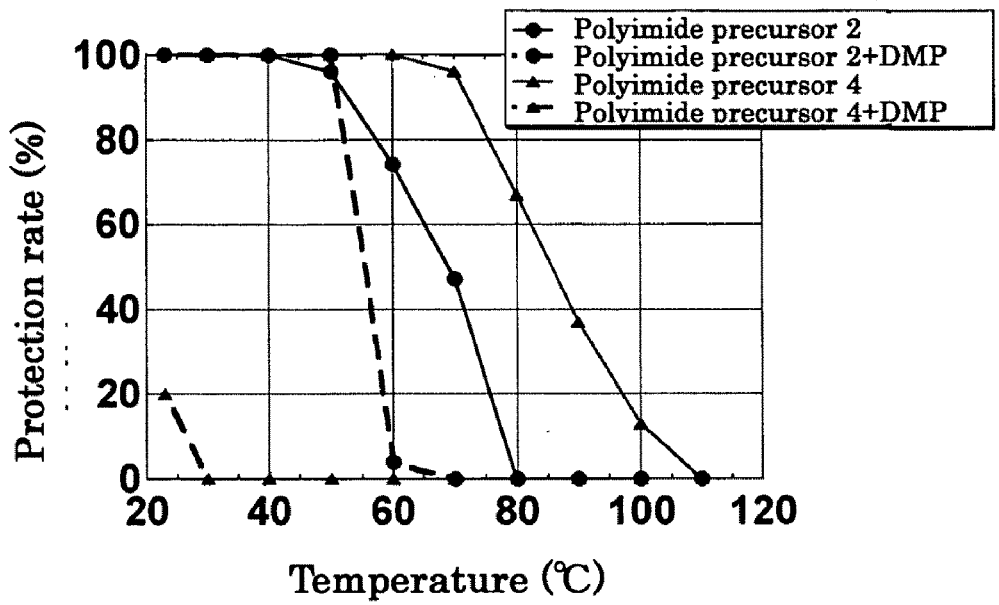
FIG. 3 is a graph showing a relationship between heating temperature and protection rate of each polyimide precursor.

<Decomposability Evaluation when Base is Added> cis-2,6-Dimethylpiperidine (DMP) was added as base to polyimide precursor 2 and polyimide precursor 4 respectively. In the similar conditions as the thermal decomposability evaluation, decomposition behaviors of polyimide precursor 2 and polyimide precursor 4 when base is added were measured. A graph of the relationship between heating temperatures and protection rates of each polyimide precursor is shown in FIG. 3.

As a result, it was confirmed that the decomposition of polyimide precursor 4 proceeds in the presence of base even at room temperature. Further, it can be understood that protective groups are almost completely eliminated at 60° C. in polyimide precursor 2, and at 30° C. in polyimide precursor 4. Since the protection rate can be changed by presence or absence of base as above, the difference of solubility in a developer is assumed to be large, and it can be concluded that polyimide precursor 2 and polyimide precursor 4 have sufficient pattern formability.

Figure 4:
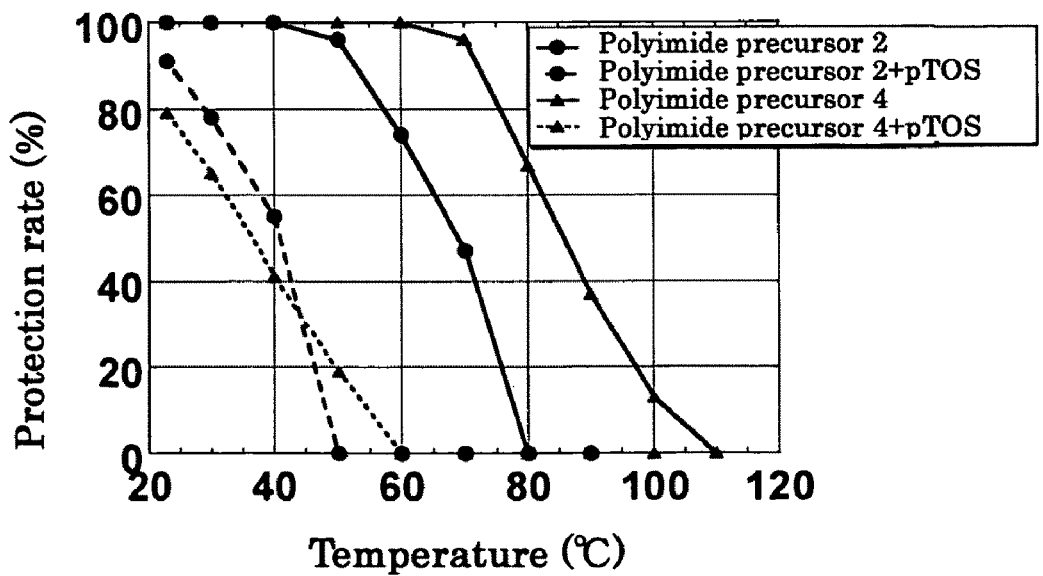
FIG. 4 is a graph showing a relationship between heating temperature and protection rate of each polyimide precursor.

<Decomposability Evaluation when Acid is Added> p-Toluenesulfonic acid (p-Tos) was added as acid to polyimide precursor 2 and polyimide precursor 4 respectively. In the similar conditions as the thermal decomposability evaluation, decomposition behaviors of polyimide precursor 2 and polyimide precursor 4 when acid is added were measured. A graph of the relationship between heating temperatures and protection rates of each polyimide precursor is shown in FIG. 4.

As a result, it was confirmed that decomposition proceeds in the presence of acid even at room temperature. Further, it can be understood that protective groups of both samples are almost completely eliminated at around 50 to 60° C. Since the protection rate can be changed by presence or absence of acid as above, the difference of solubility in a developer is assumed to be large, and it can be concluded that polyimide precursor 2 and polyimide precursor 4 have sufficient pattern formability.

<Thermal Decomposability Evaluation 2>

Each of the reaction liquids of polyimide precursor 4 and polyimide precursor 8 was applied on a chrome-plated glass by a spin coating method, and dried by heating on a hot plate. Samples obtained thereby with different heating conditions were dissolved in deuterated DMSO, and measured by NMR to determine the protection rate of each sample. As a result, when heating temperature increased and time passed, elimination of protective groups proceeded, and the protection rate decreased. The relationship between the heating temperature and the protection rate of polyimide precursor 4 is shown in FIG. 5, and the relationship between the heating temperature and the protection rate of polyimide precursor 8 is shown in FIG. 6.

<Dissolution Rate Evaluation of Polyimide Precursor>

Figure 5:
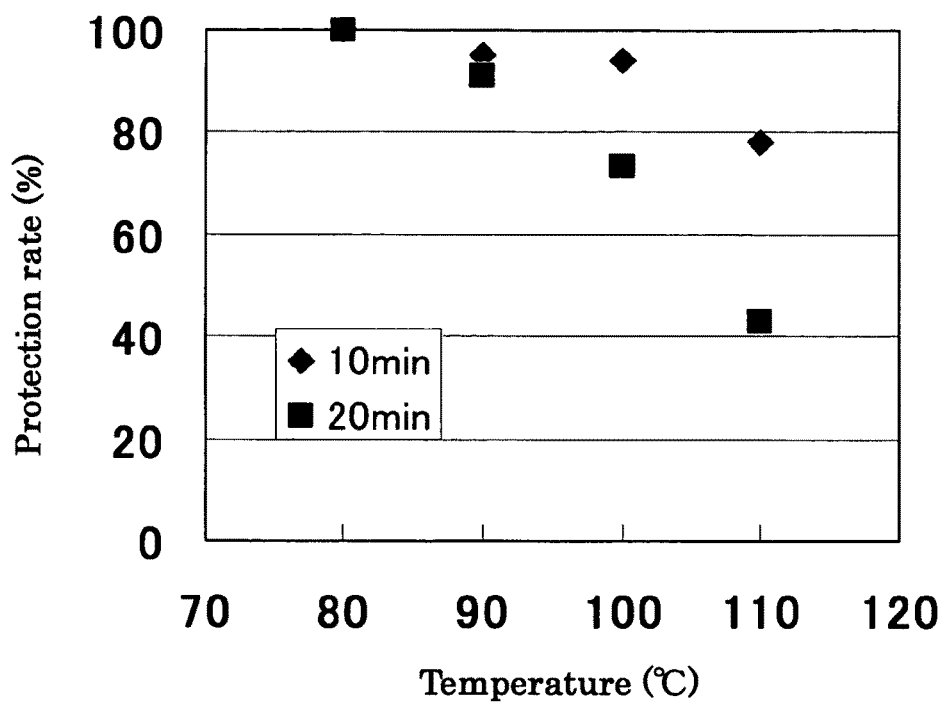
FIG. 5 is a graph showing a relationship between heating temperature and protection rate of a film made of polyimide precursor 4.
Figure 6:
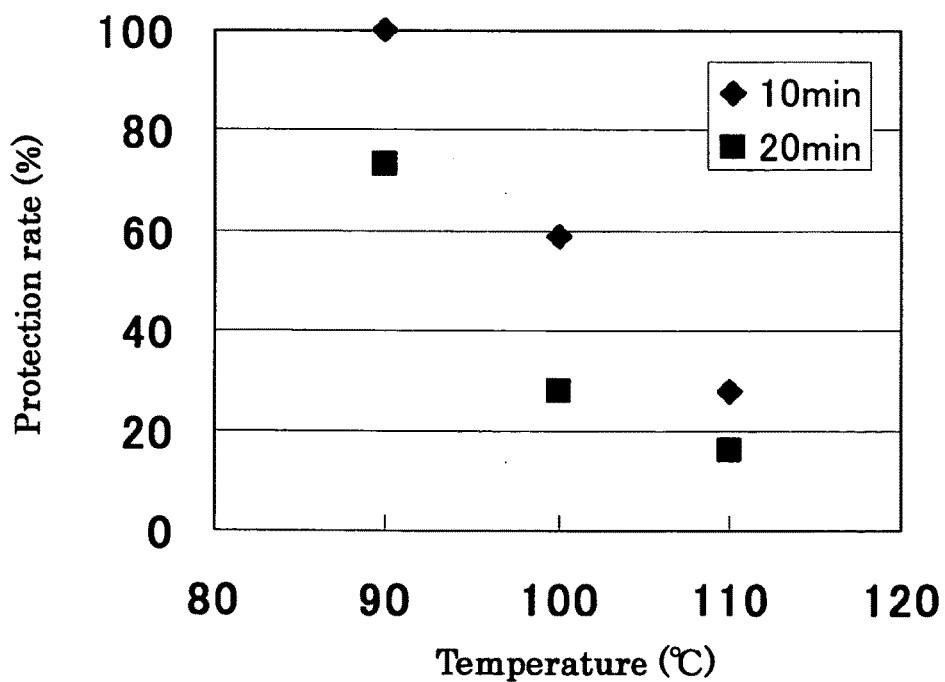
FIG. 6 is a graph showing a relationship between heating temperature and protection rate of a film made of polyimide precursor 8.

In view of the results shown in FIGS. 5 and 6, the dissolution rate of the sample of polyimide precursor 4 of the heating condition with a temperature of 110° C. and a duration of 20 minutes, and the dissolution rate of the sample of polyimide precursor 8 of the heating condition with a temperature of 100° C. and a duration of 10 minutes with respect to a 2.38 wt % tetramethylammonium hydroxide (TMAH) aqueous solution were determined. The dissolution rate of polyimide precursor 4 was 4.3 nm/s, and the dissolution rate of polyimide precursor 8 was 1.93 nm/s.

Example 1

20 wt % of an o-quinone diazide-based photosensitive agent (an ester of 2,3,4,4'-tetrahydroxybenzophenone and 6-diazo-5,6-dihydro-5-oxo-1-naphthalene sulfonic acid; product name: 4NT-300; manufactured by Toyo Gosei Co., Ltd.) with respect to a solid content of polyimide precursor 4 was added to the reaction liquid of polyimide precursor 4 of Production example 4, and stirred. Thus, photosensitive resin composition 1 was prepared.

Example 2

30 wt % of an o-quinone diazide-based photosensitive agent (an ester of 2,3,4-trihydroxybenzophenone and 6-diazo-5,6-dihydro-5-oxo-1-naphthalene sulfonic acid; product name: DTRP-250; manufactured by Daito Chemix Corporation) with respect to a solid content of polyimide precursor 8 was added to the reaction liquid of polyimide precursor 8 of Production example 8, and stirred. Thus, photosensitive resin composition 2 was prepared.

<Pattern Forming Evaluation 1 of Photosensitive Resin Composition (Positive Type)>

(1) Photosensitive resin composition 1 was applied on a chrome-plated glass by a spin coating method under the conditions below to form a film. The film was subjected to after exposure at various exposure doses, developed and rinsed.

Initial film thickness: 4.0 μm
Drying: 110° C. for 20 minutes
Development (dipping): a 2.38 wt % TMAH aqueous solution for 3 minutes (23° C.)
Rinse: $H_2O$ for 5 seconds (23° C.)

A sensitivity curve under the above conditions was made to determine sensitivity. A positive type behavior, in which an exposed portion dissolves, was shown. The sensitivity was 110 mJ/cm$^2$.

The exposure was performed by means of a manual exposure equipment (product name: MA-1100; manufactured by Dainippon Screen Mfg. Co., Ltd.). Light of a high-pressure mercury-vapor lamp was used without using a filter.

Next, exposure was performed through a photomask, and pattern forming was observed. Under the conditions below, a pattern with excellent shape was obtained. The film thickness of pattern did not decrease even after development. Further, heating was performed at 350° C. for 1 hour under nitrogen atmosphere to perform imidization. The film thickness was 2.6 μm. The pattern did not lose shape and kept the state before baking.

Figure 7:
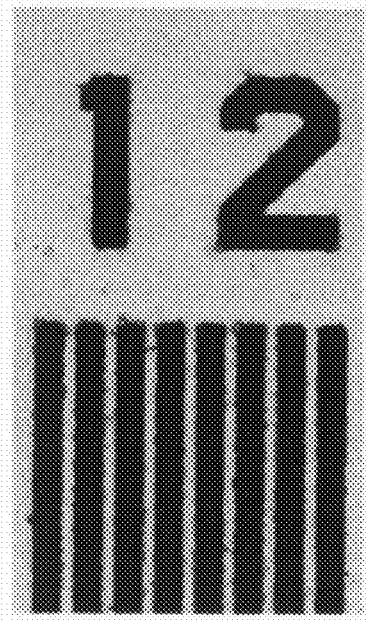
FIG. 7 is a microscope image of a pattern after development formed with photosensitive resin composition 1.

Initial film thickness: 4.0 μm
Drying: 110° C. for 20 minutes
Exposure dose: 500 mJ/cm²
Development (dipping): a 2.38 wt % TMAH aqueous solution for 5 minutes (23° C.)
Rinse: H₂O for 5 seconds (23° C.)
Film thickness after development: 4.0 μm
The obtained pattern is shown in FIG. 7.

(2) Using photosensitive resin composition 2, a pattern forming evaluation was performed similarly as the above evaluation.

Initial film thickness: 4.3 μm
Drying: 100° C. for 10 minutes
Development (dipping): a 2.38 wt % TMAH aqueous solution for 5 minutes (23° C.)
Rinse: H₂O for 20 seconds (23° C.)

A sensitivity curve under the above conditions was made to determine sensitivity. A positive type behavior, in which an exposed portion dissolves, was shown. The sensitivity was 400 mJ/cm².

Next, exposure was performed through a photomask, and pattern forming was observed. Under the conditions below, a pattern with excellent shape was obtained. The film thickness of pattern did not decrease even after development. Further, heating was performed under nitrogen atmosphere at 350° C. for 1 hour to perform imidization. The film thickness was 2.5 μm. The pattern did not lose shape and kept the state before baking.

Figure 8:
FIG. 8 is a microscope image of a pattern after development formed with photosensitive resin composition 2.

Initial film thickness: 4.3 μm
Drying: 100° C. for 10 minutes
Exposure dose: 800 mJ/cm²
Development (dipping): a 2.38 wt % TMAH aqueous solution for 5 minutes (23° C.)
Rinse: H₂O for 20 seconds (23° C.)
Film thickness after development: 4.2 μm
The obtained pattern is shown in FIG. 8.

In view of the above results, since the rate of decomposition of hemiacetal ester bonds can be controlled by the heating conditions of the polyimide precursor being used, the photosensitive resin composition of the present invention can stably control the dissolution rate with respect to the basic solution. Hence, in combination with a compound which generates a carboxylic acid by the action of light such as any of o-quinone diazide compounds, an excellent pattern can be formed.

Example 3

Using reaction liquid 4 of polyimide precursor 4, 14.25 parts by weight of polyimide precursor 4 (solid content), 39.5 parts by weight of ethylene glycol butyl vinyl ether (EG-BVE), 45.5 parts by weight of γ-butyrolactone, and 0.71 parts by weight (5 wt % of polyimide precursor 4) of DNCDP (photobase generator) were mixed. Thus, photosensitive resin composition 3 was obtained.

DNCDP has the following structure. DNCDP was synthesized by the method disclosed in Macromolecules, A. Mochizuki, Vol. 28, No. 1, 1995.

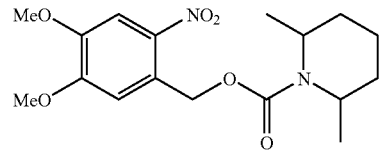

Example 4

Photosensitive resin composition 4 was prepared similarly as Example 3 except that addition of 0.71 parts by weight (5 wt % of polyimide precursor 4) of DNCDP (photobase generator) was changed to addition of 1.42 parts by weight (10 wt % of polyimide precursor 4) of DNCDP.

Example 5

Photosensitive resin composition 5 was prepared similarly as Example 3 except that addition of 0.71 parts by weight (5 wt % of polyimide precursor 4) of DNCDP (photobase generator) was changed to addition of 2.13 parts by weight (15 wt % of polyimide precursor 4) of DNCDP.

<Pattern Forming Evaluation 2 of Photosensitive Resin Composition>

Next, using photosensitive resin composition 3, pattern forming was performed under the conditions below. A microscope image after development of pattern thereby obtained is shown in FIG. 9.

Initial film thickness: 0.9 μm
Drying: 80° C. for 10 minutes
Exposure dose: 70 mJ/cm²
Heating after exposure: 120° C. for 10 minutes
Development: a 2.38 wt % TMAH aqueous solution: isopropanol (IPA)=97:3 (parts by weight) for 10 minutes (23° C.)
Rinse: a 3 wt % isopropanol aqueous solution for 15 seconds (23° C.)

Figure 9:
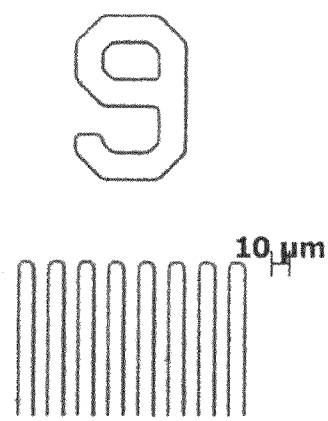
FIG. 9 is a microscope image of a pattern after development formed with photosensitive resin composition 3.

As shown in FIG. 9, an excellent pattern was obtained at a resolution by line and space of 9 μm/9 μm. The pattern did not lose shape and kept the state before baking even after imidization.

Further, after storing photosensitive resin composition 3 at room temperature for 120 hours, similar pattern forming ability was exhibited. It can be assumed that since the reaction liquid was used in preparation of photosensitive resin composition 3, protective groups decomposed by moisture were reproduced by vinyl ether in the reaction liquid.

From the aforementioned, it is clear that the photosensitive resin composition of the present invention has high sensitivity and resolution, and exhibits high storage stability.

<Pattern Forming Evaluation 3 of Photosensitive Resin Composition>

Each of photosensitive resin compositions 3 to 5 were coated on a chrome-plated glass, and dried on a hot plate at 80° C. for 10 minutes. Thus, films having a thickness of 3.5 μm were obtained. The films were exposed in a pattern under the conditions below. Samples of the films of photosensitive resin compositions 3 and 4 formed on the chrome-plated glass different in heating temperature after exposure were formed, in which the temperature was changed from 80° C. to 150° C. by 10° C. at one time. Also, samples of the film of photosensitive resin composition 5 formed on the chrome-plated glass different in heating temperature after exposure was formed, in which the temperature was changed from 90° C. to 120° C. by 10° C. at one time. The dissolution rates of an exposed portion and an unexposed portion of each sample were measured under the conditions below.

Figure 10:
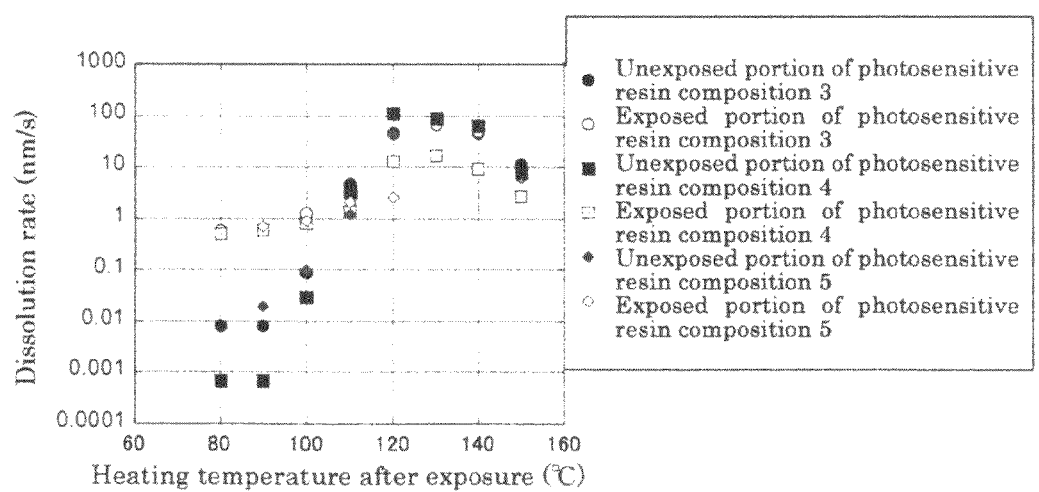
FIG. 10 is a graph showing a relationship between heating temperature after exposure and dissolution rate of an exposed portion and an unexposed portion of each of films made of photosensitive resin compositions 3 to 5.

The obtained results are shown in Table 4 and FIG. 10.

Developer: a 2.38 wt % TMAH aqueous solution: IPA=95:5 (parts by weight)

Exposure dose in the exposed portion: 3,000 mJ/cm$^2$

Condition of heating after exposure: heating at each temperature for 10 minutes on a hot plate Rinse condition: a 5 wt % isopropanol aqueous solution for 15 seconds

TABLE 4

| Heating temperature (° C.) after exposure | Dissolution rate (nm/s) | | | | | |
|---|---|---|---|---|---|---|
| | Photosensitive resin composition 3 | | Photosensitive resin composition 4 | | Photosensitive resin composition 5 | |
| | Unexposed | Exposed | Unexposed | Exposed | Unexposed | Exposed |
| 80 | 0.008 | 0.6 | 0.0007 | 0.5 | | |
| 90 | 0.008 | 0.6 | 0.0007 | 0.6 | 0.02 | 0.7 |
| 100 | 0.09 | 1.3 | 0.03 | 0.8 | 0.1 | 0.9 |
| 110 | 4.8 | 3.1 | 3.2 | 1.4 | 1.2 | 2.1 |
| 120 | 45.3 | 13.1 | 109.5 | 12.9 | 41.8 | 2.6 |
| 130 | 82.3 | 66.3 | 90.9 | 16.5 | | |
| 140 | 45.5 | 49.3 | 65.5 | 9.4 | | |
| 150 | 11.5 | 6.6 | 7.9 | 2.7 | | |

The above results show that photosensitive resin compositions 3 to 5 have a region at around 110° C. in which the dissolution rate of the unexposed portion exceeds the dissolution rate of the exposed portion under the above-mentioned conditions of forming films by coating. Specifically, at temperatures lower than 110° C., the tendency of "positive type", in which the dissolution rate of an exposed portion is higher than that of an unexposed portion, was observed. At temperatures higher than 110° C., the tendency of "negative type", in which the dissolution rate of an unexposed portion is higher than that of an exposed portion, was observed.

The analyses of IR and NMR showed that when heating temperature after exposure is less than 110° C., a slight amount of the hemiacetal ester bonds in the unexposed portion was thermally decomposed to give carboxylic acids, but most of the parts remained as the hemiacetal ester bond. On the other hand, the hemiacetal ester bonds in the exposed portion decomposed due to the action of an amine generated from the photobase generator, and a large amount of amic acids was produced.

In the case that the heating temperature after exposure was 120° C. or more, most of the hemiacetal ester bonds in the unexposed portion were thermally decomposed and changed to carboxylic acids. On the other hand, elimination of the protective groups and imidization proceeded in the exposed portion due to the action of generated amines. It is assumed that the amount of carboxyl groups in the polyimide precursor decreased when imidization proceeded, so that solubility in a developer decreased, and thus the "negative type" behavior was observed.

<Pattern Forming Evaluation 4 of Photosensitive Resin Composition (Negative Type)>

Figure 11:
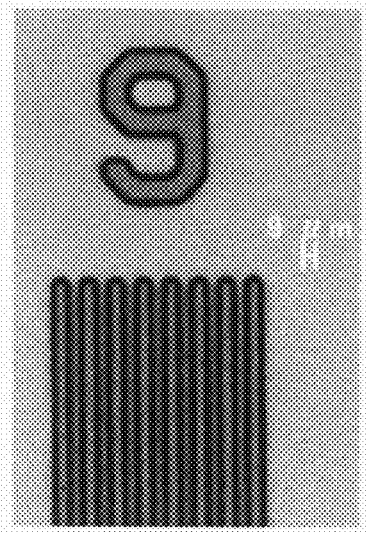
FIG. 11 is a microscope image of a pattern (negative image) after development formed with photosensitive resin composition 5.

Based on the results of Pattern forming evaluation 3, using photosensitive resin composition 5, a pattern forming evaluation was performed under the conditions below. Photosensitive resin composition 5 was applied on a chrome-plated glass, and dried on a hot plate at 80° C. for 10 minutes. Thus, a film having a thickness of 3.5 μm was obtained. The surface of the obtained film was exposed in a predetermined pattern under the exposure conditions below. Heating after exposure was performed on a hot plate at 120° C. for 10 minutes. Development was performed under the development condition below. Thus, a pattern was obtained. A microscope image of a pattern (negative image) obtained thereby is shown in FIG. 11.

Film thickness after development: 2.4 μM

Exposure dose: 4,000 mJ/cm$^2$

Developer: a 2.38 wt % TMAH aqueous solution: a 5 wt % IPA=100:5

Development time: 2 minutes

Rinse: a 5 wt % IPA aqueous solution for 15 seconds

<Pattern Forming Evaluation 5 of Photosensitive Resin Composition (Positive Type)>

Figure 12:
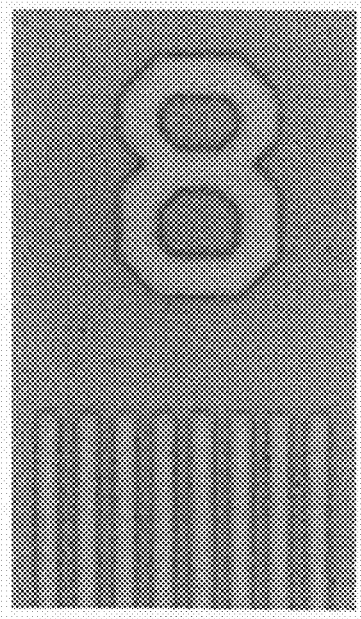
FIG. 12 a microscope image of a pattern (positive image) after development formed with photosensitive resin composition 5.

In view of the result of Pattern forming evaluation 3, pattern forming evaluation was performed using photosensitive resin composition 5 under the conditions below. Photosensitive resin composition 5 was applied on a chrome-plated glass, dried on a hot plate at 80° C. for 10 minutes. Thus, a film having a thickness of 1.5 μm was obtained. The surface of the obtained film was exposed in a predetermined pattern under the exposure conditions below. Heating after exposure was performed on a hot plate at 80° C. for 10 minutes. Development was performed under the development condition below. Thus, a pattern was obtained. A microscope image of a pattern (positive image) obtained thereby is shown in FIG. 12.

Film thickness after development: 1.5 μm

Exposure dose: 2,000 mJ/cm$^2$

Developer: a 2.38 wt % TMAH aqueous solution: a 5 wt % IPA 100:5

Development time: 40 minutes

Rinse: a 5 wt % IPA aqueous solution for 15 seconds

<Glass Transition Temperature after Imidization>

Photosensitive resin composition 3 was applied on UPILEX S 50S (product name, manufactured by Ube Industries, Ltd.) film attached on a glass, dried on a hot plate at 80° C. for 10 minutes, and peeled. Thus, a film having a thickness of 20 μm was obtained.

Similarly, a 15 wt % NMP solution of BPDA-ODA was applied on UPILEX S 50S (product name, manufactured by Ube Industries, Ltd.) film attached on a glass, dried on a hot plate at 80° C. for 10 minutes, and peeled. Thus, a film having a thickness of 15 μm was obtained.

The above-mentioned two kinds of samples were irradiated with UV by means of aligner (light source: high-pressure mercury lamp) at 500 mJ/cm$^2$ in terms of the wavelength calibrated by 365 nm, heated on a hot plate at 120° C. for 10 minutes, and then, heated at 350° C. for 1 hour (heating rate: 10° C./minutes) under nitrogen atmosphere. Films of imidized products of photosensitive resin composition 1 (thickness: 12 μm) and BPDA-ODA (thickness: 11 μm) were respectively obtained.

Dynamic viscoelasticity of each of the above films was measured by means of a viscoelasticity analyzer (product name: Solid Analyzer RSA II; manufactured by Rheometric Scientific) at a frequency of 1 Hz and a heating rate of 5° C./min.

As a result, the glass transition temperature of the photosensitive resin composition after imidization was 261° C., and that of the BPDA-ODA film was 258° C. It can be assumed that the difference is due to presence or absence of a photobase generator contained.

<Linear Thermal Expansion Coefficient after Imidization>

The film formed for measuring the glass transition temperature of photosensitive resin composition 3 was cut into width of 5 mm and length of 20 mm, and used as an evaluation sample. Linear thermal expansion coefficient was measured by means of a thermomechanical analyzer (product name: Thermo Plus TMA8310; manufactured by Rigaku Corporation). Measurement conditions were an observed length of evaluation sample of 15 mm, a heating rate of 10° C./min, and a tensile load of 1 g/25,000 μm², so that each load per area of cross section of evaluation sample is equal.

As a result, the linear thermal expansion coefficient of the photosensitive resin composition after imidization was 42.5 ppm, and that of the BPDA-ODA film was 43.9 ppm. It can be assumed that the difference is due to the presence or absence of a photobase generator contained.

<Humidity Expansion Coefficient after Imidization>

The film formed for measuring the glass transition temperature of photosensitive resin composition 3 was cut into width of 5 mm and length of 20 mm, and used as an evaluation sample. Humidity expansion coefficient was measured by means of a humidity variable mechanical analyzer (product name: modified Thermo Plus TMA8310; manufactured by Rigaku Corporation). A difference between sample lengths of a sample being stable in an environment with a temperature of 25° C. and a relative humidity of 20% and the sample the relative humidity being changed to 50% and being stable was divided by a difference in humidity (in this case 50 minus 20 is 30). Then, the value obtained thereby was divided by the sample length at 20% RH. Thereby, the humidity expansion coefficient was obtained. A tensile load was 1 g/25,000 μm² so that each load per area of cross section of the evaluation sample was equal.

As a result, the humidity expansion coefficient of the photosensitive resin composition after imidization was 21.5 ppm, and that of the BPDA-ODA film was 21.8 ppm. It can be assumed that the difference is due to the presence or absence of a photobase generator contained.

Example 6

Using reaction liquid 2 of polyimide precursor 2, 11.3 parts by weight of polyimide precursor 2 (solid content), 43.2 parts by weight of cyclohexyl vinyl ether (CVE), 45.5 parts by weight of γ-butyrolactone, and 0.57 parts by weight (5 wt % of polyimide precursor 2) of Irgacure PAG 103 (product name of a photoacid generator; manufactured by Chiba Specialty Chemicals, Inc.) were mixed. Thus, photosensitive resin composition 6 was obtained.

<Pattern Forming Evaluation 6 of Photosensitive Resin Composition>

Using photosensitive resin composition 6, a film was formed by coating under the conditions below, and subjected to exposure by various exposure doses, heating after exposure, development, and rinse.

Initial film thickness: 1.6 μm
Drying: 50° C. for 10 minutes
Heating after exposure: 50° C. for 5 minutes
Development: a 2.38 wt % TMAH aqueous solution for 2 minutes (23° C.)
Rinse: $H_2O$:IPA=97:3 for 15 seconds (23° C.)

Figure 13:
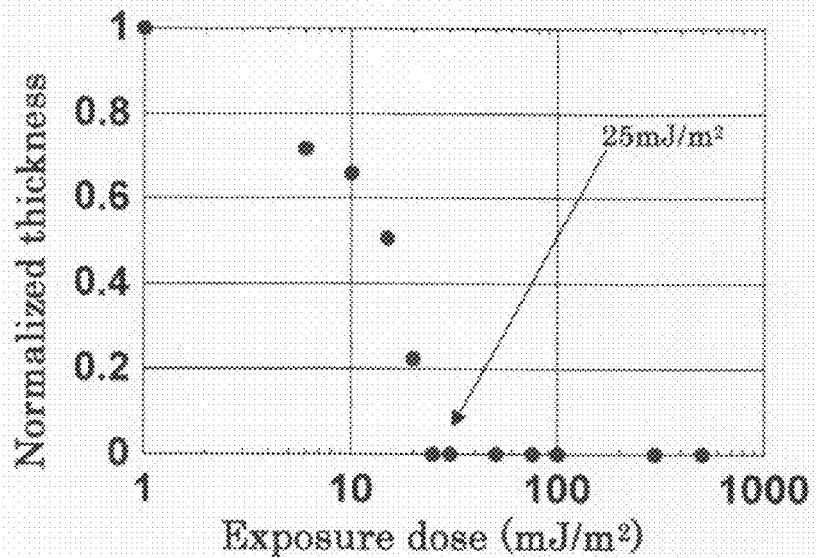
FIG. 13 is a sensitivity curve of a film made of photosensitive resin composition 6.

Using the film made of photosensitive resin composition 6, a sensitivity curve was made by changing the exposure dose. The results are shown in FIG. 13.

As a result, a high sensitivity of 25 mJ/cm² was confirmed.

Figure 14:
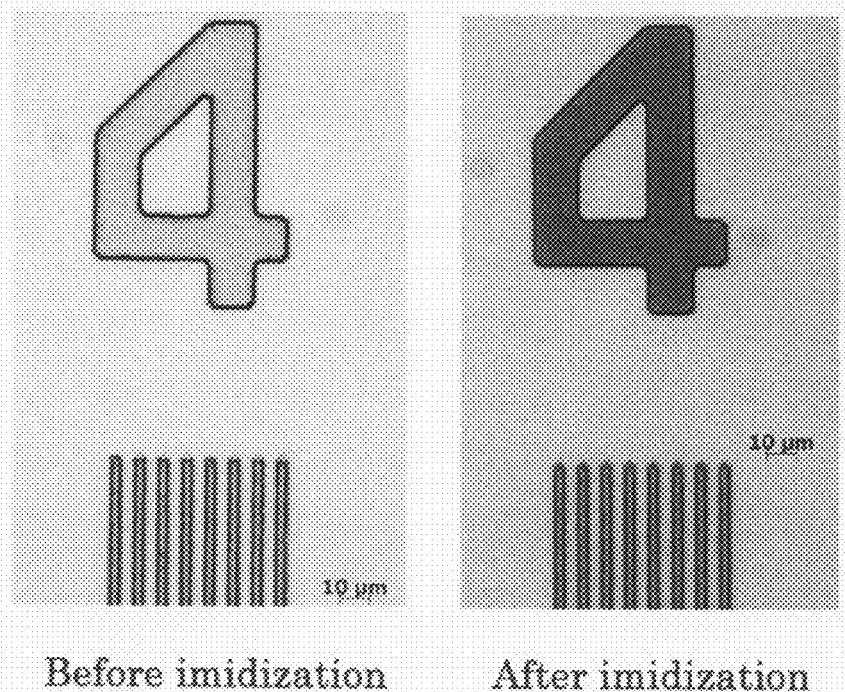
FIG. 14 is microscope images of photosensitive resin composition 6 after development and before/after imidization.

Next, using photosensitive resin composition 6, pattern forming was performed under the conditions below. Microscope images before and after development of the pattern thereby obtained are shown in FIG. 14.

Film thickness: 1.6 μm (after development), 0.9 μm (after imidization)
Drying: 50° C. for 10 minutes
Exposure dose: 70 mJ/cm²
Heating after exposure: 50° C. for 5 minutes
Development: 2.38 wt % TMAH for 2 minutes (23° C.)
Rinse: $H_2O$:IPA=97:3 for 15 seconds (23° C.)
Imidization: 350° C. for 1 hour As shown in FIG. 14, an excellent pattern was obtained at a high resolution by line and space of 4 μm/4 μm. The pattern kept the state without pattern crumbling and so on even after imidization.

Furthermore, even after storage at room temperature for 120 hours, the photosensitive resin composition exhibited similar pattern forming ability. It can be assumed that since the reaction liquid was used for preparation of the photosensitive resin composition, the protective groups decomposed by moisture were reproduced by vinyl ether in the reaction liquid.

As aforementioned, it is clear that the photosensitive resin composition of the present invention has high sensitivity and resolution, and shows high storage stability.

What is claimed is:

1. A photosensitive resin composition comprising a polyimide precursor having repeating units represented by the following formula (1) and a photobase generator and comprising no photoacid generator:

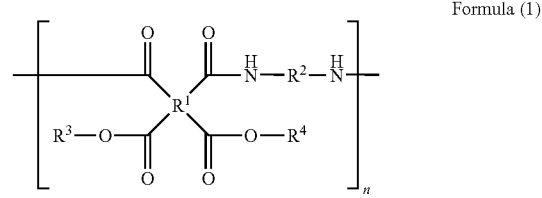

Formula (1)

wherein $R^1$ is a tetravalent organic group; $R^2$ is a divalent organic group; $R^1$s may be the same or different from each other and $R^2$s may be the same or different from each other in the repeating units; $R^3$ and $R^4$ each independently represent a monovalent organic group having a structure represented by the following formula (2) and may be the same or different from each other; $R^3$s may be the same or different from each other and $R^4$s may be the same or different from each other in the repeating units; and n is the number of the repeating units wherein n is 1 or greater:

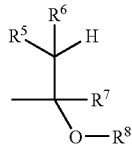

Formula (2)

wherein $R^5$, $R^6$ and $R^7$ each independently represent a hydrogen atom, a halogen atom or a monovalent organic group; $R^8$ is a monovalent organic group; $R^8$s may be the same or different from each other in the repeating units; 35 mole % or less of $R_8$s are organic groups having a reactive group selected from the group consisting of an ethylenic unsaturated bond, a glycidyl group, an oxetanyl group, an isocyanuric group; and $R^5$, $R^6$, $R^7$ and $R^8$ may be bonded to each other to form a ring structure.

2. A pattern forming method comprising an exposure step of irradiating a surface of a film or molded body of the photosensitive resin composition defined by claim 1 with electromagnetic waves in a predetermined pattern, and a developing step of developing either an exposed or unexposed portion with a solvent which is capable of dissolving the exposed or unexposed portion as a developer.

3. The photosensitive resin composition according to claim 1, wherein the polyimide precursor comprises repeating unit represented by the formula (1) of 100 mole %.

4. The photosensitive resin composition according to claim 1, wherein, in the polyimide precursor, at least one $R^8$ is a monovalent C2-C30 organic group containing an ether bond.

5. The photosensitive resin composition according to claim 1, wherein, in the polyimide precursor, $R^8$ in the formula (2) contains two or more kinds of organic groups.

6. The photosensitive resin composition according to claim 1, further comprising one or more kinds of solvents selected from lactones and sulfoxides, wherein 55 parts by weight or more of the vinyl ether compound is contained with respect to 100 parts by weight of the solvent.

\* \* \* \* \*